United States Patent
Matsumoto et al.

(10) Patent No.: US 10,083,819 B2
(45) Date of Patent: Sep. 25, 2018

(54) ANTENNA AND PLASMA PROCESSING APPARATUS

(71) Applicant: TOKYO ELECTRON LIMITED, TOKYO (JP)

(72) Inventors: Naoki Matsumoto, Miyagi (JP); Koji Koyama, Miyagi (JP); Jun Yoshikawa, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 536 days.

(21) Appl. No.: 14/675,873

(22) Filed: Apr. 1, 2015

(65) Prior Publication Data

US 2015/0206712 A1     Jul. 23, 2015

Related U.S. Application Data

(63) Continuation of application No. PCT/JP2013/075524, filed on Sep. 20, 2013.

(30) Foreign Application Priority Data

Oct. 3, 2012    (JP) ................... 2012-221383

(51) Int. Cl.
    *C23C 16/00*       (2006.01)
    *H01J 37/32*       (2006.01)
    *C23C 16/511*      (2006.01)
    *H05H 1/46*        (2006.01)
    *H01Q 13/10*       (2006.01)
                     (Continued)

(52) U.S. Cl.
CPC ........ *H01J 37/3222* (2013.01); *C23C 16/511* (2013.01); *H01J 37/32238* (2013.01); *H01J 37/32715* (2013.01); *H01Q 13/10* (2013.01); *H01Q 21/064* (2013.01); *H01Q 21/20* (2013.01); *H05H 1/46* (2013.01);
(Continued)

(58) Field of Classification Search
CPC ........... H01J 37/32192; H01J 37/32201; H01J 37/32211; H01J 37/3222; H01J 37/32229; H01J 37/32238; H01J 37/32247; H01J 37/32256; H01J 37/32266; H01J 37/32275; H01J 37/32284; H01J 37/32293; H01J 37/32302; H01J 37/32311
USPC .................. 118/723 MW, 723 ME, 723 MR, 118/723 MA; 156/345.36, 345.41, 345.42
See application file for complete search history.

(56) References Cited

U.S. PATENT DOCUMENTS

2013/0093321 A1     4/2013    Yoshikawa et al.

FOREIGN PATENT DOCUMENTS

JP        11-121195 A     4/1999
JP      2000-277296 A    10/2000
(Continued)

OTHER PUBLICATIONS

International Search Report dated Dec. 17, 2013 in PCT/JP2013/075524 (5 pages).
English translation of WO 2011/125524 A1 (28 pages).

*Primary Examiner* — Luz L Alejandro Mulero
(74) *Attorney, Agent, or Firm* — Rothwell, Figg, Ernst & Manbeck, P.C.

(57) ABSTRACT

An antenna includes a dielectric window and a slot plate provided at one surface of the dielectric window. The slot plate includes a plurality of slot pairs each being formed of two slots. The slot pairs are concentrically disposed about a centroid position of the slot plate and provided at positions where straight lines extending from the centroid position of
(Continued)

the slot plate and passing through each slot pair are not overlapped with each other.

9 Claims, 20 Drawing Sheets

(51) Int. Cl.
    *H01Q 21/06*           (2006.01)
    *H01Q 21/20*           (2006.01)
    *H01L 21/3213*        (2006.01)

(52) U.S. Cl.
    CPC ... *H01J 2237/334* (2013.01); *H01L 21/32137* (2013.01); *H05H 2001/4667* (2013.01)

(56) References Cited

FOREIGN PATENT DOCUMENTS

| | | |
|---|---|---|
| JP | 2007-311668 A | 11/2007 |
| JP | 2011-150943 A | 8/2011 |
| WO | 2007/136043 A1 | 11/2007 |
| WO | 2011/125524 A1 | 10/2011 |

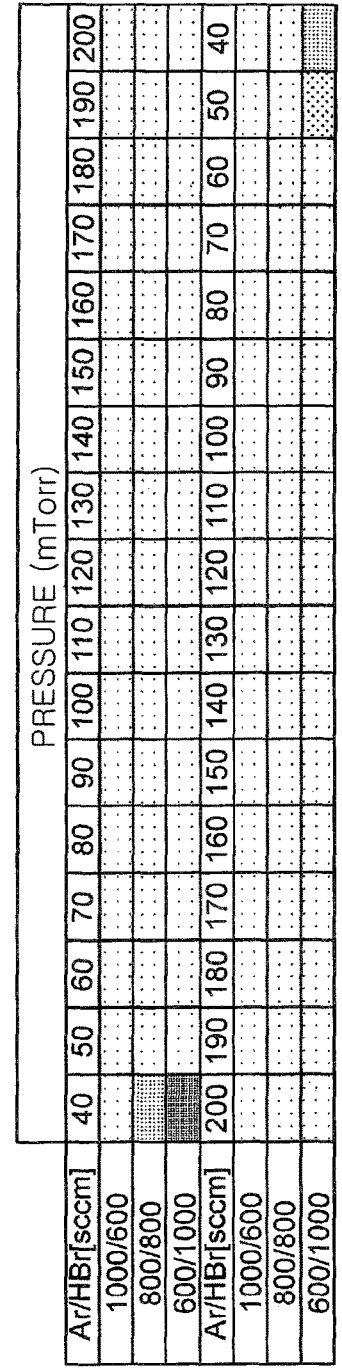

COMPARATIVE EXAMPLE 3

TEST EXAMPLE 3

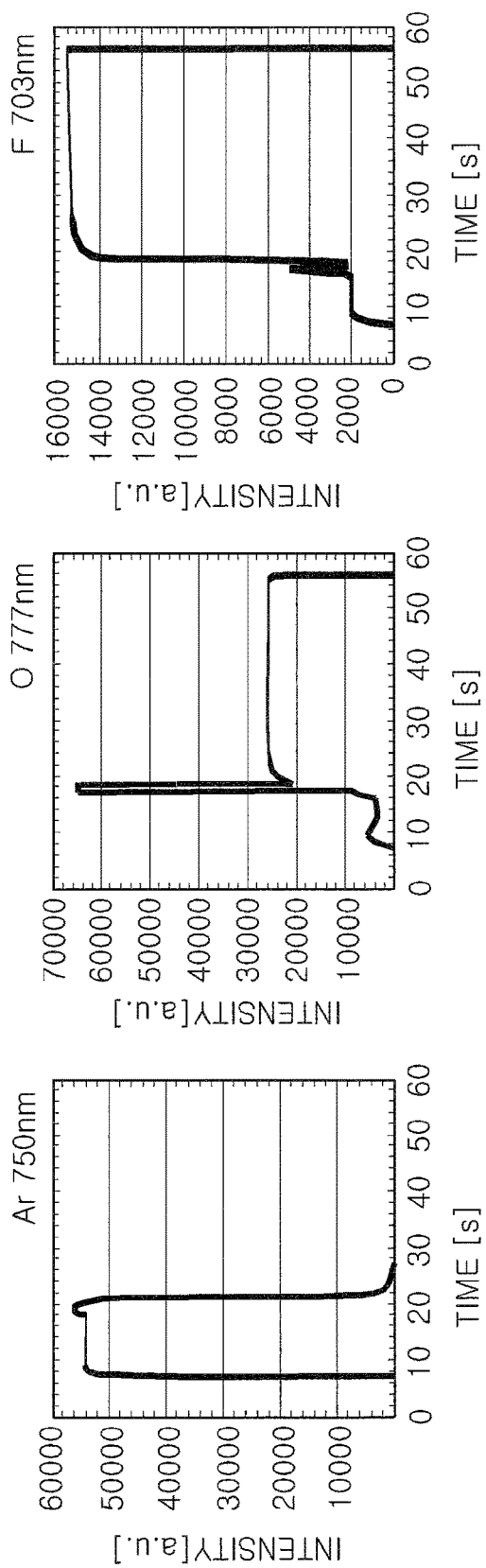

ANTENNA AND PLASMA PROCESSING APPARATUS

CROSS-REFERENCE TO RELATED APPLICATION

This application is a Continuation application of PCT International Application No. PCT/JP2013/075524 filed on Sep. 20, 2013, which designated the United States. This application claims priority to Japanese Patent Application No. 2012-221383 filed on Oct. 3, 2012, the entire contents of which are incorporated herein by reference.

FIELD OF THE INVENTION

The present invention relates to an antenna and a plasma processing apparatus.

BACKGROUND OF THE INVENTION

Conventionally, a plasma etching apparatus using a radial line slot antenna is known (see, e.g., Japanese Patent Application Publication No. 2007-311668). In this plasma etching apparatus, a circular plate-shaped slot antenna having a plurality of slots is installed on a dielectric window of a processing chamber. The slots include a plurality of slot pairs formed of two elongated microwave radiation slots directed in different directions. The slot pairs are arranged in a double ring shape (i.e., a concentric circular shape) about the centroid position of the slot antenna. The microwave is incident on the central position of the slot antenna, emitted radially, and radiated from the slots. The microwave radiated from the slots of the slot antenna is introduced into a processing space of the processing chamber through a dielectric window made of a dielectric material. A processing gas is turned into a plasma by the energy of the microwave.

The microwave plasma generated by the radial line slot antenna has a feature that a plasma having a relatively high electron temperature of several eV which is generated just below the dielectric window (referred to as "plasma excitation region") is diffused and becomes a plasma having a relatively low electron temperature of about 1 eV to 2 eV in a region just above a substrate and below the dielectric window by a distance of about 100 mm or more (referred to as "plasma diffusion region"). In other words, the electron temperature distribution of the plasma occurs as a function of a distance from the dielectric window.

In the radial line slot antenna type plasma etching apparatus, an etching gas is supplied to a low electron temperature region and dissociation control of the etching gas (control of the amount of etching species generated in the plasma) is performed. By doing so, etching reaction (chemical reaction on a substrate surface by the etching species) is controlled. Accordingly, the etching can be performed with high precision and damage to the substrate is considerably reduced. For example, when etching or the like is performed in a step of forming a spacer, it is possible to manufacture devices with design dimensions and reduce the damage to the substrate such as a recess or the like.

However, as the processes become various and complicated, the plasma stability needs to be further improved. For example, in the plasma etching apparatus using a radial line slot antenna described in Japanese Patent Application Publication No. 2007-311668, the radiation electric field intensity is decreased in the case of using as a processing gas a negative gas that is turned into negative ions due to attachment of electrons in the plasma diffusion region. Therefore, in order to ensure the plasma stability, it is required to control a pressure or a microwave power.

SUMMARY OF THE INVENTION

In this technical field, it is required to provide an antenna and a plasma processing apparatus capable of improving plasma stability by improving a radiation electric field intensity with respect to an input power.

An antenna in accordance with an aspect of the present invention includes a dielectric window and a slot plate. The slot plate is provided at one surface of the dielectric window. The slot plate includes a plurality of slot pairs each being formed of two slots. The slot pairs are concentrically disposed about a centroid position of the slot plate. The slot pairs are provided at positions where straight lines extending from the centroid position of the slot plate and passing through each slot pair are not overlapped with each other.

The microwave is incident on the centroid position of the slot plate and radially emitted. If the slot pairs are disposed at positions where the straight lines extending from the centroid position of the slot plate and passing through each slot pair are overlapped with each other, i.e., if the slot pairs are overlapped with each other when seen from the centroid position of the slot plate toward the outer region in the diametrical direction, the microwave is initially radiated from a slot pair close to the centroid position. Therefore, the microwave having a low electric field intensity propagates to the other slot pairs disposed on the straight line extending from the centroid position of the slot plate and passing through the slot pair close to the centroid position. Accordingly, the microwave having a low electric field intensity is radiated from the other slot pairs. Meanwhile, in the antenna, the slot pairs arranged in a concentric circular shape are provided at positions where the straight lines extending from the centroid position of the slot plate and passing through each of the slot pairs are not overlapped with each other. In other words, on the straight line extending from the centroid position of the slot plate and passing through a slot pair, other slot pairs are not provided. Accordingly, the slot pairs having a low microwave radiation efficiency for an input power can be excluded, which makes it possible to relatively improve distribution of the input power to the other slot pairs. As a result, the radiation electric field intensity with respect to the input power is improved and the plasma stability can be improved.

In the aspect, the slot plate may include a first slot group, a second slot group, a third slot group and a fourth slot group. The first slot group is spaced from the centroid position of the slot plate by a first distance. The second slot group is spaced from the centroid position of the slot plate by a second distance. The third slot group is spaced from the centroid position of the slot plate by a third distance. The fourth slot group is spaced from the centroid position of the slot plate by a fourth distance. A relationship between the first to the fourth distance satisfies the first distance<the second distance<the third distance<the fourth distance. Slots in the first slot group and slots in the second slot group which correspond to each other form a plurality of first slot pairs, and slots in the third slot group and slots in the fourth slot group which correspond to each other form a plurality of second slot pairs. A slot in the second slot group of each first slot pair is positioned on a first straight line extending from the centroid position of the slot plate and passing through a slot in the first slot group of the corresponding first slot pair. A slot in the fourth slot group of each second slot pair is positioned on a second straight line extending from the centroid position of the slot plate and passing through a slot in the third slot group of the corresponding second slot pair. All the slots are arranged such that the first straight line and the second straight line are not overlapped with each other.

With the above configuration, the slot pairs having a low microwave radiation efficiency for the input power can be excluded, which makes it possible to relatively improve distribution of the input power to the other slot pairs. As a result, the radiation electric field intensity with respect to the input power is improved and the plasma stability can be improved.

In the aspect, the number of the slots in the first slot group and the number of the slots in the second slot group may be the same number denoted by N1, and the number of the slots in the third slot group and the number of the slots in the fourth slot group may be the same number denoted by N2, wherein N2 is an integer multiple of N1. With the above configuration, a plasma having high in-plane symmetry can be generated.

In the aspect, a width of the slots in the first slot group may be the same as a width of the slots in the second slot group, a width of the slots in the third slot group may be the same as a width of the slots in the fourth slot group, and the width of the slots in the first slot group and the width of the slots in the second slot group may be greater than the width of the slots in the third slot group and the width of the slots in the fourth slot group. With the above configuration, the radiation electric field intensity of the first and second slot groups which are close to the centroid position of the slot plate can become lower than that of the third and fourth slot groups which are far from the centroid position of the slot plate. Since the microwave is attenuated during propagation, the radiation electric field intensity of the microwave becomes uniform over the surface of the slot plate by employing the above configuration. Accordingly, the plasma having high in-plane uniformity can be generated.

In the aspect, an angle between a diameter extending from the centroid position of the slot plate toward a target slot and a lengthwise direction of the target slot may be the same in each of the first to the fourth slot group. A slot in the first slot group and a slot in the second slot group that are positioned on the same diameter extending from the centroid position of the slot plate may be elongated in different directions. Further, a slot in the third slot group and a slot in the fourth slot group that are positioned on the same diameter extending from the centroid position of the slot plate may be elongated in different directions. With the above configuration, the reflection on two slots of a slot pair is cancelled, so that the uniformity of the radiation electric field intensity of the microwave can be improved.

In the aspect, the other surface of the dielectric window may include a flat surface surrounded by an annular first recess, and a plurality of second recesses formed in the flat surface so as to surround a centroid position of the flat surface. When seen from a direction perpendicular to a main surface of the slot plate, a centroid position of each of the second recesses may be positioned in each of the slots of the slot plate. With the above configuration, the in-plane uniformity can be further improved.

In the aspect, the second recesses may have a circular shape in a plan view. When the second recesses have a circular shape, the shape from the center has a high equivalence and, hence, stable plasma is generated.

A plasma processing apparatus in accordance with another aspect of the present invention includes an antenna, a processing chamber, a mounting table and a microwave introduction line. The antenna includes a dielectric window and a slot plate. The slot plate is provided at one surface of the dielectric window. The slot plate includes a plurality of slot pairs each being formed of two slots. The slot pairs are arranged in a concentric circular shape about a centroid position of the slot plate. The slot pairs are provided at positions where straight lines extending from the centroid position of the slot plate and passing through each slot pair are not overlapped with each other. The processing chamber includes the antenna. The mounting table is provided in the processing chamber to face the other surface of the dielectric window, and mounts thereon a substrate to be processed. The microwave introduction line connects a microwave generator and the slot plate.

The plasma processing apparatus can provide the same effect as the antenna.

EFFECT OF THE INVENTION

As described above, according to the aspects and embodiments of the present invention, there are provided an antenna and a plasma processing apparatus which are capable of improving plasma stability by improving a radiation electric field intensity with respect to an input power.

BRIEF DESCRIPTION OF THE DRAWINGS

The objects and features of the present invention will become apparent from the following description of embodiments, given in conjunction with the accompanying drawings, in which:

FIGS. 15A and 15B shows the stability evaluation results of the microwave and the RF in the test example and the comparative example;

FIGS. 19A to 19C show the discharge stability evaluation results in the test example.

DETAILED DESCRIPTION OF THE EMBODIMENTS

Figure 1:
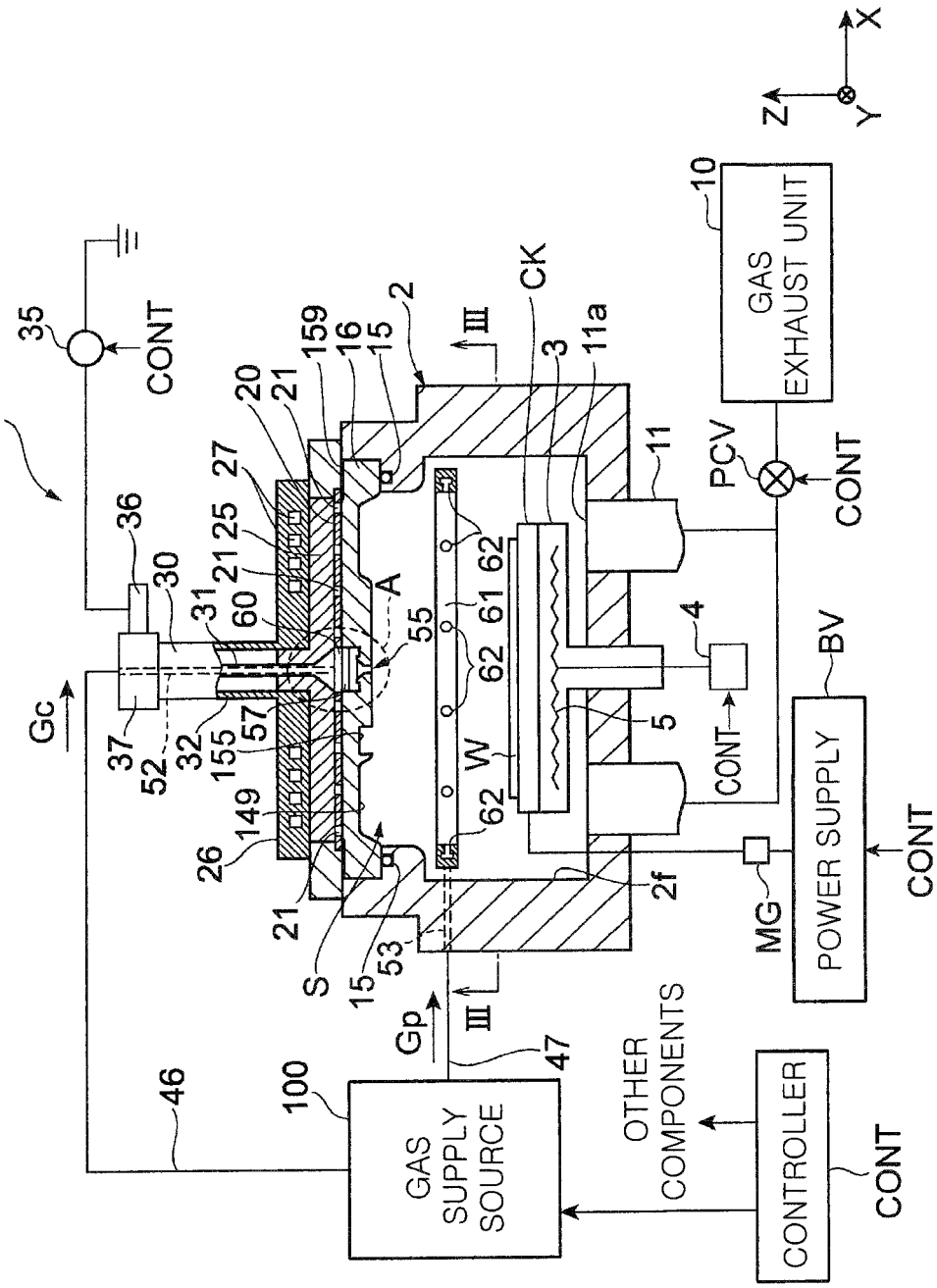
FIG. 1 is a vertical cross sectional view of a plasma processing apparatus in accordance with an embodiment of the present invention.

Hereinafter, various embodiments of the present invention will be described in detail with reference to the accompanying drawings. Like reference numerals will be used for like or corresponding parts in the respective drawings.

FIG. 1 is a vertical cross sectional view of a plasma processing apparatus in accordance with an embodiment of the present invention. A plasma processing apparatus 1 includes a cylindrical processing chamber 2. A ceiling portion of the processing chamber 2 is covered by a dielectric window (ceiling plate) 16 made of a dielectric material. The processing chamber 2 is made of, e.g., aluminum, and is electrically grounded. An inner wall surface of the processing chamber 2 is coated by an insulating protective film 2f such as alumina or the like.

A mounting table 3 for mounting thereon a semiconductor wafer (hereinafter, referred to as "wafer") as a substrate is provided at a center of a lower portion in the processing chamber 2. The wafer W is held on a top surface of the mounting table 3. The mounting table 3 is made of ceramic, e.g., alumina, alumina nitride or the like. A heater 5 is embedded in the mounting table 3, so that the wafer W can be heated to a predetermined temperature. The heater 5 is connected to a heater power supply 4 through a wiring provided in a column.

An electrostatic chuck CK for electrostatically attracting the wafer W mounted on the mounting table 3 is provided on the top surface of the mounting table 3. The electrostatic chuck CK is connected to a bias power supply BV for applying a bias direct current or a high frequency power (RF power) via a matching unit MG.

Provided at a bottom portion of the processing chamber 2 is a gas exhaust line 11 for exhausting a processing gas through a gas exhaust port 11a disposed at a position lower than the surface of the wafer W mounted on the mounting table 3. A gas exhaust unit 10 such as a vacuum pump or the like is connected to the gas exhaust line 11 via a pressure control valve PCV. The gas exhaust unit 10 communicates with the inside of the processing chamber 2 via the pressure control valve PCV. A pressure in the processing chamber 2 is controlled to a predetermined pressure by the pressure control valve PCV and the gas exhaust unit 10.

The dielectric window 16 is provided at the ceiling portion of the processing chamber 2 through a sealing 15 such as an O-ring or the like for ensuring airtightness. The dielectric window 16 is made of a dielectric material, e.g., quartz, alumina ($Al_2O_3$), aluminum nitride (AlN) or the like. The dielectric window 16 transmits a microwave.

A circular plate-shaped slot plate 20 is provided on a top surface of the dielectric window 16. The slot plate 20 is made of a conductive material, e.g., copper plated or coated with Ag, Au, or the like. A plurality of slots having, e.g., a T-shape or an L-shape is concentrically arranged at the slot plate 20.

A dielectric plate 25 for compressing a wavelength of a microwave is provided on the top surface of the slot plate 20. The dielectric plate 25 is made of a dielectric material, e.g., quartz ($SiO_2$), alumina ($Al_2O_3$), aluminum nitride (AlN), or the like. The dielectric plate 25 is covered with a conductive cover 26. An annular heat medium flow path 27 is formed in the cover 26. The cover 26 and the dielectric plate 25 are controlled to a predetermined temperature by a heat medium flowing through the heat medium flow path 27. In the case of a microwave of 2.45 GHz, for example, a wavelength in vacuum is about 12 cm and a wavelength in the dielectric window 16 made of alumina is about 3 cm to 4 cm.

A coaxial waveguide 30 for propagating a microwave is connected to a center of the cover 26. The coaxial waveguide 30 includes an inner conductor 31 and an outer conductor 32. The inner conductor 31 is connected to a center of the slot plate 20 while penetrating through a center of the dielectric plate 25.

The coaxial waveguide 30 is connected to a microwave generator 35 via a mode converter 37 and a rectangular waveguide 36. Microwaves of 860 MHZ, 915 MHz or 8.35 GHz may be used instead of the microwave of 2.45 GHz.

A microwave generated by the microwave generator 35 propagates through the rectangular waveguide 36, the mode converter 37, the coaxial waveguide 30, and the dielectric plate 25, which serve as a microwave introduction line. The microwave transmitted to the dielectric plate 25 is supplied into the processing chamber 2 through the slots 21 of the slot plate 20 and the dielectric window 16. An electric field is formed below the dielectric window 16 by the microwave and a processing gas in the processing chamber 2 is turned into a plasma.

A lower end portion of the inner conductor 31 connected to the slot plate 20 has a truncated cone shape. Therefore, the microwave can be efficiently transmitted from the coaxial waveguide 30 to the dielectric plate 25 and the slot plate 20 without a loss.

The microwave plasma generated by the radial line slot antenna has a feature that a plasma having a relatively high electron temperature that is generated just below the dielectric window 16 (hereinafter, referred to as "plasma excitation region") is diffused and becomes a plasma having a relatively low electron temperature of about 1 eV to 2 eV in a region just above the wafer W (hereinafter, referred to as "plasma diffusion region"). In other words, unlike the plasma generated by a parallel plate type plasma processing apparatus, the microwave plasma generated by the radial line slot antenna has a feature that the electron temperature distribution of the plasma occurs as a function of a distance from the dielectric window 16. More specifically, the electron temperature of several eV to about 10 eV in a region just below the dielectric window 16 decreases to about 1 eV to 2 eV in a region just above the wafer W. Since the wafer W is processed in the region (plasma diffusion region) where the electron temperature of the plasma is low, serious damage such as a recess or the like is not inflicted on the wafer W. If the processing gas is supplied to the region where the electron temperature of the plasma is high (plasma excitation region), the processing gas is easily excited and dissociated. If the processing gas is supplied to the region where the electron temperature of the plasma is low (the plasma diffusion region), the degree of dissociation is decreased compared to the case where the processing gas is supplied to the vicinity of the plasma excitation region.

A central introduction unit 55 for introducing the processing gas to the central portion of the wafer W is provided at the center of the dielectric window 16 at the ceiling portion of the processing chamber 2. A processing gas supply line 52 is formed at the inner conductor 31 of the coaxial waveguide 30. The central introduction unit 55 is connected to the processing gas supply line 52.

The central introduction unit 55 includes: a cylindrical block 57 inserted into a cylindrical space 143 (see FIG. 8) provided at the center of the dielectric window 16; a gas storage space 60 formed to have an appropriate size between a bottom surface of the inner conductor 31 of the coaxial waveguide 30 and a top surface of the block 57; and a tapered space 143a (see FIG. 8) connected to a cylindrical space having a gas injection opening 59 at a leading end thereof. The block 57 is made of a conductive material, e.g., aluminum or the like, and is electrically grounded. A plurality of central inlet openings 58 penetrates through the block 57 in a vertical direction.

Figure 3:
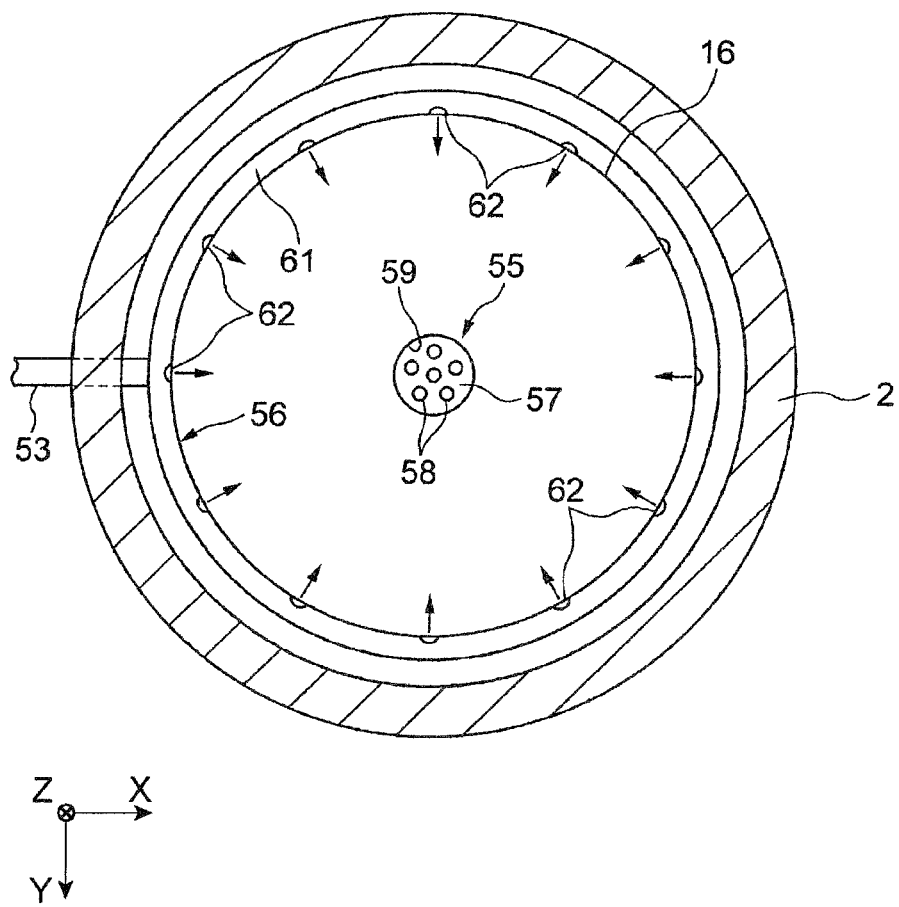
FIG. 3 is a cross sectional view taken along a line of FIG. 1.

In FIG. 3, the size of the gas injection opening 59 shown in FIG. 3 is exaggeratedly shown in order to visualize the central inlet openings 58. The shape of the space 143a is not limited to a tapered shape and may be simply a cylindrical shape. In this case, the size of the gas injection opening 59 is increased as shown in FIG. 3. The central inlet openings 58 have a circular or elongated hole shape in a plan view in consideration of a required conductance or the like. The block 57 made of aluminum is coated by anodically oxidized alumina ($Al_2O_3$), yttria ($Y_2O_3$) or the like.

The processing gas supplied into the gas storage space 60 through the supply line 52 penetrating through the inner conductor 31 is diffused in the gas storage space 60 and then injected downward toward the central portion of the wafer W through the central inlet openings 58 of the block 57.

In the processing chamber 2, a ring-shaped peripheral introduction unit 61 for supplying a processing gas to a peripheral portion of the wafer W is provided so as to surround the periphery of the space above the wafer W. The peripheral introduction unit 61 is positioned below the central inlet openings 58 formed at the ceiling portion and above the wafer W mounted on the mounting table 3. The peripheral introduction unit 61 is an annular hollow pipe. A plurality of peripheral inlet openings 62 is formed at an inner circumferential side of the peripheral introduction unit 61, the peripheral inlet openings 62 being spaced apart from each other at a regular interval along the circumferential direction introduction unit. The processing gas is injected through the peripheral inlet openings 62 toward the center of the peripheral introduction unit 61. The peripheral introduction unit 61 is made of, e.g., quartz. A supply line 53 made of stainless steel penetrates through the sidewall of the processing chamber 2. The supply line 53 is connected to the peripheral introduction unit 61. The processing gas supplied into the peripheral introduction unit 61 through the supply line 53 is diffused in the peripheral introduction unit 61 and injected toward the inner side of the peripheral introduction unit 61 through the peripheral inlet openings 62. The processing gas injected through the peripheral inlet openings 62 is supplied to a space above the peripheral portion of the wafer W. Instead of providing the ring-shaped peripheral introduction unit 61, a plurality of peripheral inlet openings 62 may be formed at the inner surface of the processing chamber 2.

Figure 2:
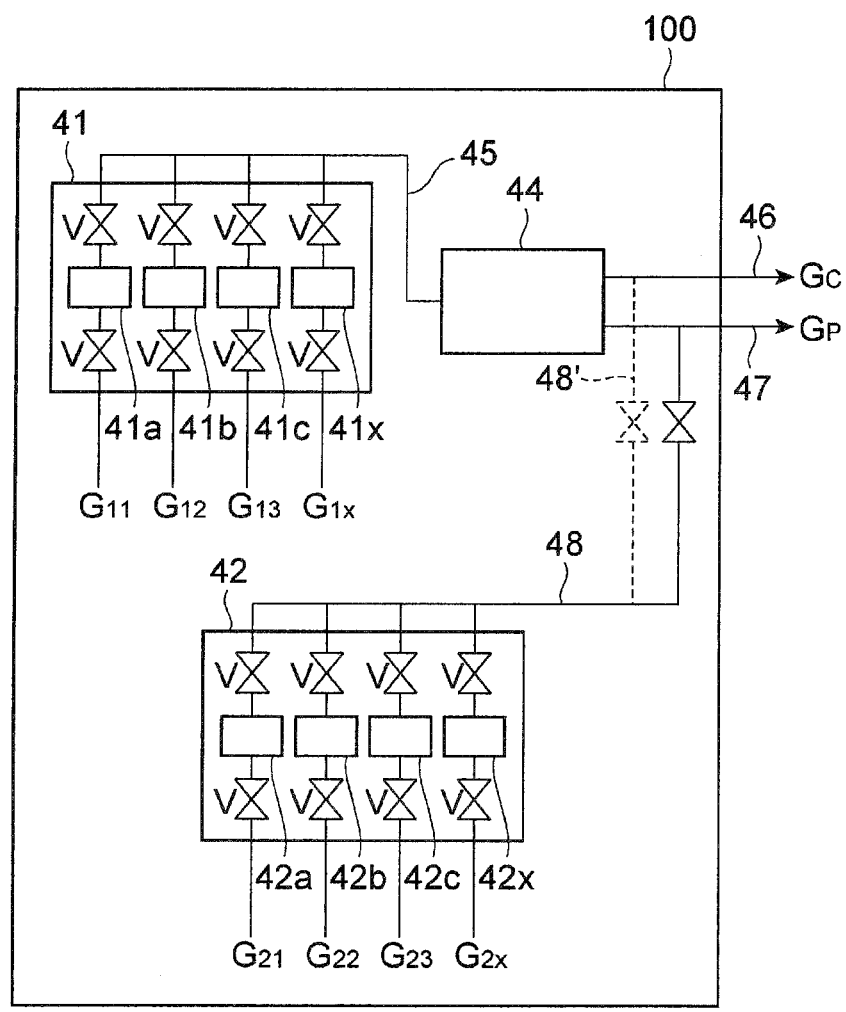
FIG. 2 is a block diagram showing a detailed structure of a gas supply source.

FIG. 2 is a block diagram showing a detailed structure of a gas supply source. A gas supply source 100 includes a common gas source 41 and an additional gas source 42. The common gas source 41 and the additional gas source 42 supply processing gases for plasma etching, plasma CVD processing and the like.

A common gas line 45 is connected to the common gas source 41 and also connected to a flow splitter 44. The flow splitter 44 is provided at the common gas line 45 and divides the common gas line 45 into a first branch common gas line 46 and a second branch common gas line 47. The flow splitter 44 can control a ratio of flow rates of gases flowing in the first and second branch common gas lines 46 and 47. Here, the first branch common gas line 46 is connected to the central introduction unit 55 (see FIG. 1) through the supply line 52 and supplies a central introduction gas Gc to the central introduction unit 55. The second branch common gas line 47 is connected to the peripheral introduction unit 61 (see FIG. 1) through the supply line 53 and supplies a peripheral introduction gas Gp to the peripheral introduction unit 61.

The additional gas source 42 is connected to the second branch common gas line 47 through the additional gas line 48. Further, the additional gas source 42 may be connected to the first branch common gas line 46 through an additional gas line 48'. Moreover, the additional gas source 42 may be connected to both of the branch common gas lines 46 and 47 through the additional gas lines 48 and 48'.

The common gas source 41 includes a plurality of gases G11, G12, G13 and G1x and flow rate control valves 41a, 41b, 41c and 41x for controlling flow rates of the gases, respectively. Valves V are provided at the upstream and downstream lines connected to the flow rate control valves 41a, 41b, 41c and 41x, and opens/closes the paths of the lines. The flow rate control valves 41a, 41b, 41c and 41x are connected to the common gas line 45 via the respective valves V.

The additional gas source 42 includes a plurality of gases G21, G22, G23 and G2x and flow rate control valves 42a, 42b, 42c and 42x for controlling flow rates of the gases, respectively. Valves V are provided at the upstream and downstream lines connected to the flow rate control valves 42a, 42b, 42c and 42x, and opens/closes the paths of the lines. The flow rate control valves 42a, 42b, 42c and 42x are connected to the additional gas line 48 via the respective valves V.

A controller CONT shown in FIG. 1 controls the flow rate control valves 41a, 41b, 41c, 41x, 42a, 42b, 42c and 42x and the various valves V in the gas supply source and ultimately controls a partial pressure ratio of a specific gas contained in the gases Gc and GP respectively flowing in the branch common gas lines 46 and 47. The controller CONT controls the flow rates of the respective gases and determines a flow rate and a partial pressure for each gas species in the common gas supplied to the flow splitter 44. In this apparatus, it is possible to change the partial pressure for each gas species, and the gas species itself in the central introduction gas Gc supplied to the central portion of the wafer W and the peripheral introduction gas Gp supplied to the peripheral portion of the wafer W. Hence, the characteristics of the plasma processing can be variously modified.

A rare gas (Ar gas or the like) may be used as a gas G1x of the common gas source 41. However, other additional gases may also be used. In the case of etching a silicon-based film such as polysilicon or the like, Ar gas, HBr gas (or $Cl_2$ gas) and $O_2$ gas are supplied as the additional gases G21, G22 and G23, respectively. In the case of etching an oxide film such as $SiO_2$ or the like, Ar gas, CHF-based gas, CF-based gas, and $O_2$ gas are supplied as the additional gases G21, G22, G23 and G2x, respectively. In the case of etching a nitride film such as SiN or the like, Ar gas, CF-based gas, CHF-based gas, and $O_2$ gas are supplied as the addition gases G21, G22, G23 and G2x, respectively.

The CHF-based gas may include $CH_3(CH_2)_3CH_2F$, $CH_3(CH_2)_4CH_2F$, $CH_3(CH_2)_7CH_2F$, $CHCH_3F_2$, $CHF_3$, $CH_3F$, $CH_2F_2$ and the like.

The CF-based gas may include $C(CF_3)_4$, $C(C_2F_5)_4$, $C_4F_8$, $C_2F_2$, $C_5F_8$ and the like. However, it is preferable to use $C_5F_8$ in order to obtain dissociated species suitable for the etching.

In this apparatus, the same gas may be supplied from the common gas source 41 and the additional gas source 42, or different gases may be supplied from the common gas source 42 and the additional gas source 42.

In order to suppress dissociation of the etching gas, a plasma excitation gas and an etching gas may be supplied from the common gas source 41 and the additional gas source 42, respectively. For example, in the case of etching a silicon-based film, Ar gas is only supplied as the plasma excitation gas from the common gas source 41 and HBr gas and gas are only supplied as the etching gas from the additional gas sources 42.

The common gas source 41 may supply a common gas other than a cleaning gas such as $O_2$, $SF_6$ or the like.

The above-described gas contains a so-called negative gas. The negative gas denotes a gas having an electron attachment cross section area at an electron energy of 10 eV or less, e.g., HBr, $SF_6$ or the like.

Here, a technique that controls a distribution ratio of the common gas by using the flow splitter 44 and controls the amount of gases introduced from the central inlet openings 58 (see FIG. 3) and the peripheral introduction unit 61 (see FIG. 1) in order to achieve uniform plasma generation and uniform processing over the surface of the wafer W is referred to as "RDC (Radical Distribution Control)". The RDC is expressed as a ratio of the amount of gas introduced from the central inlet openings 58 with respect to the amount of gas introduced from the peripheral introduction unit 61. In general RDC, the same gas is supplied from the central introduction unit 55 and the peripheral introduction unit 61. An optimum RDC value is determined experimentally depending on the types of films to be etched or various conditions. A technique for further supplying an additional gas to the central introduction unit 55 or the peripheral introduction unit 61 is referred to as "ARDC (Advanced Radical Distribution Control)".

In the etching process, by-products (etching residue or deposits) are generated by the etching. In order to improve gas flow in the processing chamber 2 and easily discharge the by-products to the outside of the processing chamber, it is considered to introduce gases from the central introduction unit 55 and the peripheral introduction unit 61 alternately. This can be realized by switching a RDC value temporally. For example, the by-products are removed from the processing chamber 2 by repeating a step of introducing a large amount of gas to the central portion of the wafer W and a step of introducing a large amount of gas to the peripheral portion of the wafer W at a predetermined cycle and controlling gas flow. From this, a uniform etching rate can be obtained.

Figure 4:
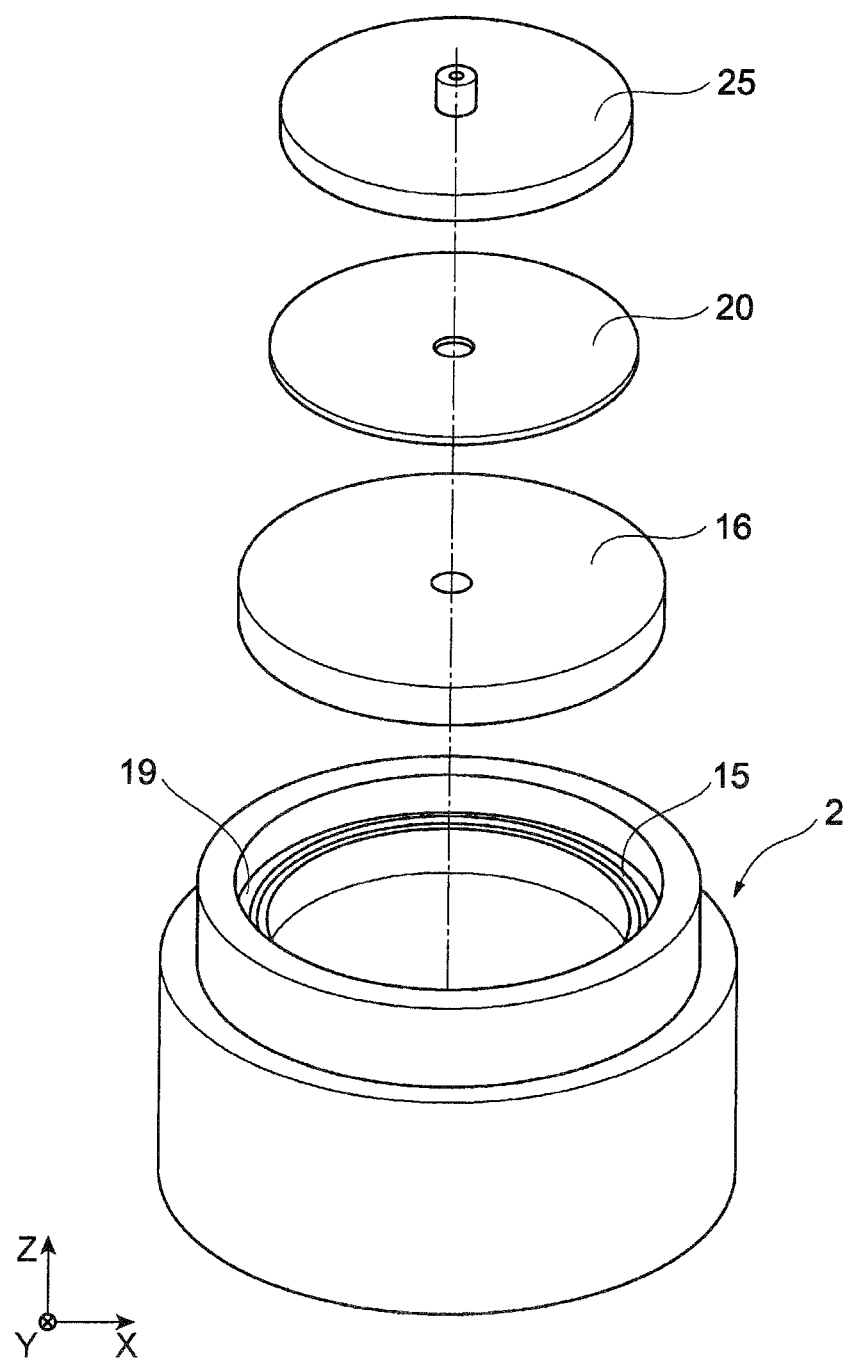
FIG. 4 is an exploded perspective view of a structure around a slot plate.

FIG. 4 is an exploded perspective view of a structure of the slot plate and its vicinity. The dielectric window 16 is installed at the plasma processing apparatus 1 such that the bottom surface thereof (where the recesses are formed) is positioned on the surface of an annular member 19 forming a part of the sidewall of the processing chamber 2. The slot plate 20 is provided on top of the dielectric window 16. The dielectric plate 25 is provided on top of the slot plate 20. The dielectric window 16, the slot plate 20 and the dielectric plate 25 have a circular shape in a plan view, and the centers thereof are positioned on the same axis (Z-axis).

The slot plate 20 has slots of various patterns. In FIG. 4, the illustration of the slots is omitted in the slot plate 20 for clear explanation, but instead, the slot plate 20 having the slots is illustrated in FIG. 5.

Figure 5:
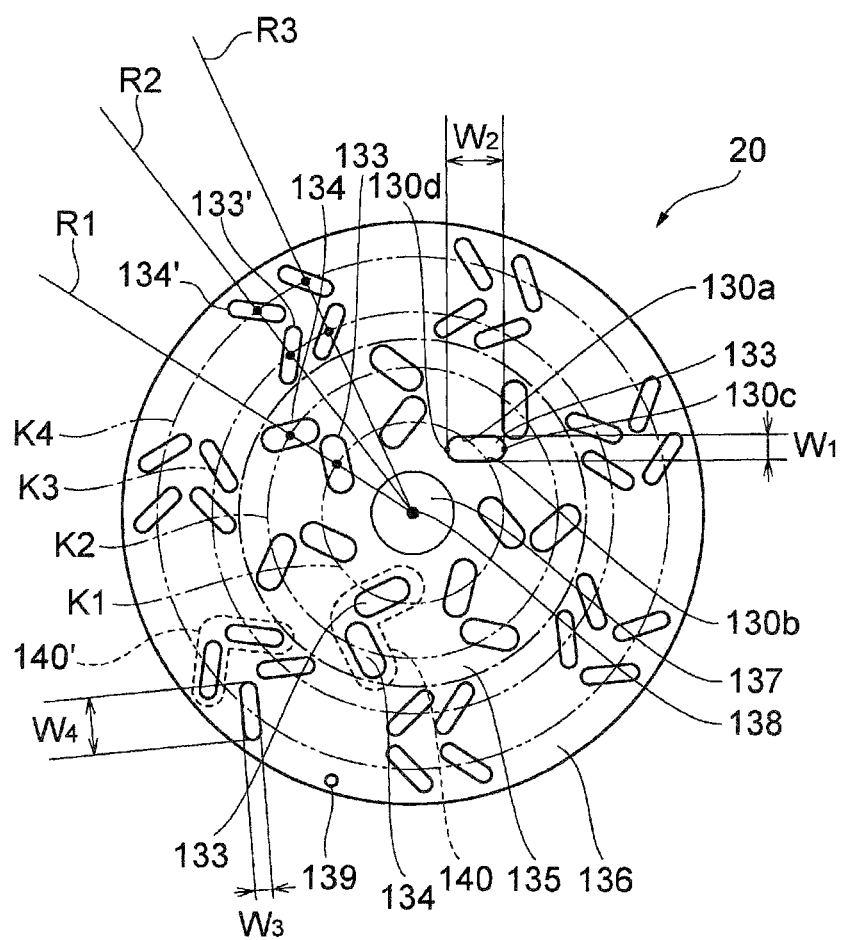
FIG. 5 is a top view of the slot plate.

FIG. 5 is a top view of the slot plate 20. The slot plate 20 has a thin circular plate shape. Opposite surfaces of the slot plate 20 in the plate thickness direction are flat. The slot plate 20 has a plurality of slots penetrating therethrough in the thickness direction. A first slot 133 elongated in one direction and a second slot 134 elongated in a perpendicular direction to the first slot 133 adjoin to each other and form a pair. Specifically, two adjacent slots 133 and 134 form a pair and are arranged in a substantially L-shape that is disconnected at the center. In other words, the slot plate 20 has slot pairs 140, each being formed of the first slot 133 extending in one direction and the second slot 134 extending in a perpendicular direction to the one direction. In the same manner, a slot pair 140' is formed of a third slot 133' and a fourth slot 134'. Examples of the slot pairs 140 and 140' are illustrated in a region indicated by dotted lines in FIG. 5.

The slot pairs are divided into an inner slot pair group 135 disposed at an inner peripheral side and an outer slot pair group 136 disposed at an outer peripheral side. The inner slot pair group 135 has seven slot pairs 140 provided in an inner region of a virtual circle indicated by a dashed dotted line in FIG. 5. The outer slot pair group 136 has fourteen slot pairs 140' provided in an outer region of the virtual circle indicated by the dashed dotted line in FIG. 5. The slot pairs 140 and 140' are disposed in a concentric circular shape so as to surround the center (centroid position) 138 of the slot plate 20.

In the inner slot pair group 135, the seven slot pairs 140 are spaced from each other at a regular interval in the circumferential direction. With such a configuration, for the seven slot pairs 140 in the inner slot pair group 135, one slot of each pair can be arranged at positions corresponding to the positions of the second recesses that are circular dimples. The outer slot pair group 136 is arranged so as not to overlap with the inner slot pair group 135 when seen from the center 138 of the slot plate 20 toward the outer region in the diametric direction. For this reason, in the outer slot pair group 136, seven sets of two slot pairs 140' are spaced from each other at a regular interval in the circumferential direction.

In the present embodiment, an opening width of the first slot 133, i.e., a distance $W_1$ between one wall 130a and the other wall 130b extended in the lengthwise direction of the first slot 133, is set to 14 mm. A length of the first slot 133 in the lengthwise direction indicated by $W_2$ in FIG. 5, i.e., a length $W_2$ between one end 130c and the other end 130d of the first slot 133 in the lengthwise direction, is set to 35 mm. Although the width $W_1$ and the length $W_2$ may be changed within a range of ±10%, the apparatus can operate even when the width and the length are not within such ranges. A ratio $W_1/W_2$ of the short side to the long side in the first slot 133 is 14/35=0.4. The opening shape of the first slot 133 is the same as that of the second slot 134. That is, if the first slot 133 is rotated by an angle of 90°, the rotated first slot 133 becomes the second slot 134. When an elongated hole such as a slot is formed, the length ratio $W_1/W_2$ is smaller than 1.

An opening width $W_3$ of the fourth slot 134' is smaller than an opening width $W_1$ of the first slot 133. In other words, the opening width $W_1$ of the first slot 133 is larger than the opening width $W_3$ of the fourth slot 134'. Here, the opening width $W_3$ of the fourth slot 134' is, e.g., 10 mm. A length of the fourth slot 134' in the lengthwise direction which is denoted by $W_4$ in FIG. 5 is the same as the length $W_2$ of the first slot 133. Although the width $W_3$ and the length $W_4$ may be changed within a range of ±10%, the apparatus can operate even when the width and the length are not within such ranges. A ratio $W_3/W_4$ of the short side to the long side in the fourth slot 134' is 10/35≈0.29. The opening shape of the fourth slot 134' is the same as that of the third slot 133'. That is, if the third slot 133' is rotated by an angle of 90°, the rotated third slot 133' becomes the fourth slot 134'. When an elongated hole such as a slot is formed, the length ratio $W_3/W_4$ is smaller than 1.

A through-hole 137 is formed at the center of the slot plate 20 in the diametrical direction. A reference hole 139 is formed through the slot plate 20 in the plate thickness direction thereof at an outer region of the outer slot pair group 136 in order to allow the slot plate 20 to be easily positioned in the circumferential direction thereof. Therefore, the position of the slot plate 20 in the circumferential direction with respect to the processing chamber 2 or the dielectric window 16 is determined by using the reference hole 139 as a mark. The slot plate 20 has rotational symmetry about the center 138 in the diametrical direction except the reference hole 139.

Further, the structure of the slot plate 20 will be described in detail. The slot plate 20 includes: a first slot group 133 spaced from the centroid position 138 of the slot plate 20 by a first distance K1 (indicated by a circle K1); a second slot group 134 spaced from the centroid position 138 by a second distance K2 (indicated by a circle K2); a third slot group 133' spaced from the centroid position 138 by a third distance K3 (indicated by a circle K3); and a fourth slot group 134' spaced from the centroid position 138 by a fourth distance K4 (indicated by a circle K4).

Here, the first to the fourth distances K1 to K4 have a relationship of K1<K2<K3<K4. An angle between a lengthwise direction of a target slot (one of the slots 133, 134, 133' and 134') and straight lines (a first straight line R1 and a second straight line R2 or R3) extending from the centroid position 138 of the slot plate and passing through the target slot is the same in each of the first to the fourth slot group 133, 134, 133' and 134'.

The slot 133 of the first slot group and the slot 134 of the second slot group which are positioned on the same diameter (on the first straight line R1) extending from the centroid position 138 of the slot plate 20 are elongated in different directions (orthogonally in this example). The slot 133' of the third slot group and the slot 134' of the fourth slot group which are positioned on the same diameter (on the second straight line R2 or R3) extending from the center 138 of the slot plate 20 are elongated in different directions (orthogonally in this example). The slots 133, 134, 133', 134' are arranged such that the straight line R1 and the straight line R2, or the straight line R1 and the straight line R3 are not overlapped with each other. For example, the angle between the straight line R1 and the straight line R2, or the angle between the straight line R1 and the straight line R3 is greater than or equal to 10°. With such a configuration, the slots having a low microwave radiation efficiency for the input power can be excluded, which makes it possible to relatively improve distribution of the input power to the other slots. As a result, the radiation electric field intensity with respect to the input power is improved and the plasma stability can be improved.

The number of the slots 133 of the first slot group and the number of the slots 134 of the second slot group are the same, the number being N1. The number of the slots 133' of the third slot group and the number of the slots 134' of the fourth slot group are the same, the number being N2. N2 is an integer multiple of N1. With this configuration, a plasma having high in-plane symmetry can be generated.

Figure 6:
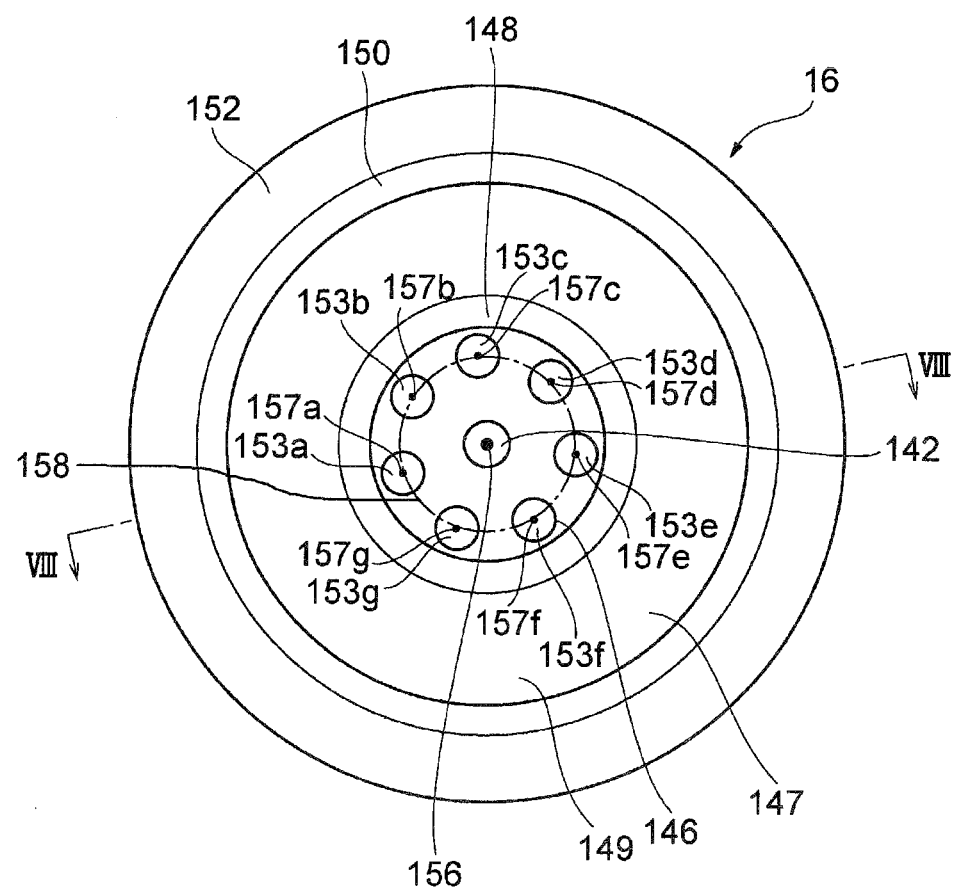
FIG. 6 is a top view of a dielectric window.
Figure 8:
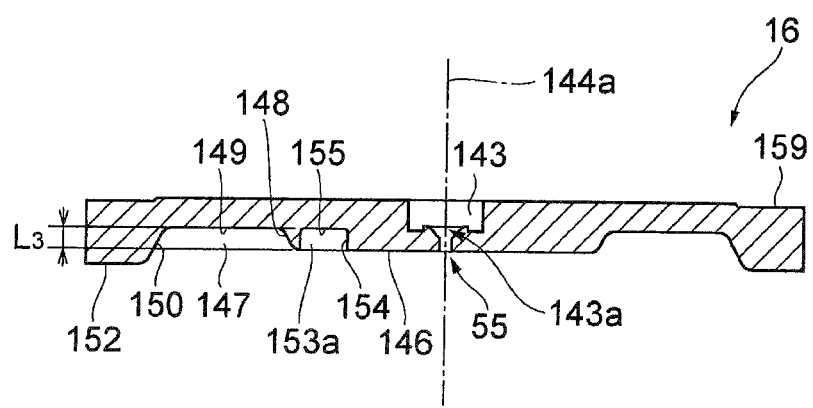
FIG. 8 is a cross sectional view of the dielectric window.

FIG. 6 is a top view of the dielectric window. FIG. 8 is a cross sectional view of the dielectric window. The dielectric window 16 has a substantially circular plate shape and has a predetermined plate thickness. The dielectric window 16 is made of a dielectric material. Specifically, the dielectric window 16 is made of quartz, alumina or the like. The slot plate 20 is provided on a top surface 159 of the dielectric window 16.

A through-hole 142 penetrating through the dielectric plate 16 in a plate thickness direction thereof, i.e., in a perpendicular direction to a sheet surface of FIG. 6 is formed at the center of the dielectric plate 16 in a diametrical direction thereof. A lower region of the through-hole 142 serves as a gas supply port of the central introduction unit 55 and an upper region of the through-hole 142 serves as a recess 143 where the block 57 of the central introduction unit 55 is disposed. A central axis 144*a* of the dielectric window 16 to the diametrical direction is indicated by a dashed dotted line in FIG. 8.

An annular first recess 147 that is tapered inwardly in the plate thickness direction of the dielectric window 16 is formed at an outer region of a flat surface 146 in the diametrical direction. The flat surface 146 is a bottom surface of the dielectric window 16 facing a space where the plasma is generated when the dielectric window 16 is attached to the plasma processing apparatus. The flat surface 146 is disposed at a central region of the dielectric window 16 in the diametrical direction. At the central flat surface 146, circular second recesses 153 (153*a* to 153*g*) are formed at a regular interval along the circumferential direction of the flat surface 146. The annular first recess 147 includes: an inner tapered surface 148 tapered outward from the outer edge of the flat surface 146, i.e., inclined with respect to the flat surface 146; a flat bottom surface 149 extending straightly outward from the inner tapered surface 148 in the diametrical direction, i.e., in parallel to the flat surface 146; and an outer tapered surface 150 tapered outward from the bottom surface 149, i.e., inclined with respect to the bottom surface 149.

Angles of the tapered surfaces, i.e., an angle defined by an extended direction of the inner tapered surface 148 with respect to the bottom surface 149 and an angle defined by an extended direction of the outer tapered surface 150 with respect to the bottom surface 149, are properly set. In the present embodiment, the angles are all the same at any position in the circumferential direction. The inner tapered surface 148, the bottom surface 149, and the outer tapered surface 150 form a continuous smooth curved surface. Further, an outer peripheral flat surface 152 extending straightly outward in the diametrical direction, i.e., in parallel to the flat surface 146, is provided at a radially outer region from the outer tapered surface 150. The outer peripheral flat surface 152 serves as a supporting surface for the dielectric window 16.

The dielectric window 16 is attached to the processing chamber 2 such that the outer peripheral flat surface 152 is positioned at an upper end surface of the annular member 19 (see FIG. 4).

Due to the presence of the annular first recess 147, a region where the thickness of the dielectric window 16 is continuously changed is formed at the outer region of the dielectric window 16 in the diametrical direction. Accordingly, a resonance region where the dielectric window has a thickness suitable for various processing conditions for plasma generation can be formed. As a result, high stability of the plasma can be obtained at the outer region in the diametrical direction under various processing conditions.

The second recesses 153 (153a to 153g) recessed inwardly from the flat surface 146 in the plate thickness direction of the dielectric window 16 are formed at a radially inner region of the annular first recess 147. The second recesses 153 have a circular shape in a plan view. Each of the second recesses 153 has a cylindrical inner wall surface and a flat bottom surface. Since a circle is a polygon having infinite corners, the second recesses 153 may have a polygonal shape having finite corners in a plan view. It is considered that the plasma is generated in the recess when the microwaves are introduced. If the recess has a circular shape when seen from the top, the shape from the center has high uniformity, so that the plasma can be stably generated.

In the present embodiment, the total number of the second recesses 153 is seven. The number of the second recesses 153 is equal to that of the inner slot pairs. The seven second recesses 153a to 153g have the same shape. That is, the recessed shapes, and the depths and diameters of the recesses and the like of the second recesses 153a to 153g are all the same. The seven second recesses 153a to 153g are spaced from each other at a regular interval so as to have rotation symmetry about the center 156 of the dielectric window 16 in the diametrical direction. When seen from the plate thickness direction of the dielectric window 16, centers 157a to 157g of the circular seven second recesses 153a to 153g are positioned on a circle 158 having the same center 156 as the dielectric window 16. Therefore, when the dielectric window 16 is rotated by about 51.42° (=360°/7) about the center 156 of the dielectric window 16, the same shape as before the rotation is obtained. The circle 158 is indicated by a dashed dotted line in FIG. 6. A diameter of the circle 158 is 154 mm. A diameter of the second recesses 153a to 153g is 30 mm.

A depth of the second recesses 153 (153a to 153g), i.e., a distance $L_3$ between the flat surface 146 and the bottom surface 155 in FIG. 8, is properly set. It is set to about 32 mm in the present embodiment. The diameter of the second recesses 153 and the distance from the bottom surfaces of the second recesses 153 to the top surface of the dielectric window are set to be ¼ of a wavelength λg of the microwave introduced thereto. In the present embodiment, the diameter of the dielectric window 16 is about 460 mm. The diameter of the circle 158, the diameter of the recesses 153, the diameter of the dielectric window 16 and the depth of the recesses 153 may vary within a range of ±10%. However, conditions for operating the apparatus are not limited thereto and the apparatus can operate as long as the plasma is confined in the recesses. If the diameter or depth of the recesses close to the center is increased, the plasma density becomes higher at the central portion than at the peripheral portion. In that case, the balance therebetween may be controlled.

Due to the presence of the second recesses 153a to 153g, the electric field of the microwave can concentrate in the recesses and a mode can be firmly locked at the inner region of the dielectric window 16 in the diametrical direction. In this case, since the region where the mode is firmly locked can be obtained at the inner region of the dielectric window 16 in the diametrical direction regardless of various changes in processing conditions, the plasma can be stably and uniformly generated and, thus, the substrate can be more uniformly processed over the surface. Especially, the second recesses 153a to 153g have rotation symmetry, so that the region where the mode is firmly locked at the inner region of the dielectric window 16 in the diametrical direction can have a high axial symmetry. As a result, the generated plasma has a high axial symmetry.

The dielectric window 16 configured as described above has a wide range of process margin and the generated plasma has a high axial symmetry.

Figure 7:
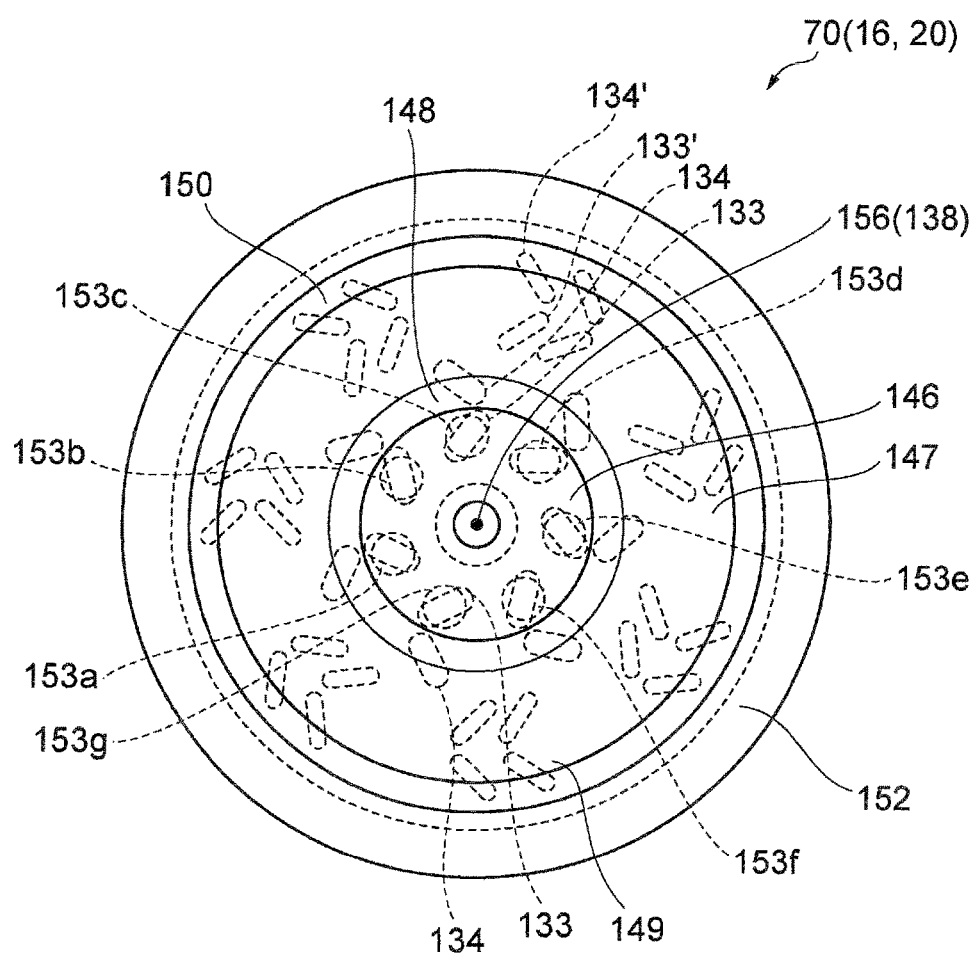
FIG. 7 is a top view of an antenna formed by combining the slot plate and the dielectric window.

FIG. 7 is a plan view showing the antenna 70 formed by combining the slot plate 20 and the dielectric window 16. FIG. 7 illustrates the radial line slot antenna seen from the bottom along the Z-axis shown in FIG. 1. In the plan view, the outer tapered surface 150 and the slots 134' of the fourth slot group (the fourth slot group from the center) are partially overlapped with each other. Further, the annular flat bottom surface 149 and the slots 133' of the third slot group (the third slot group from the center) are overlapped with each other.

Furthermore, in the plan view, the inner tapered surface 148 and the slots 134 of the second slot group (the second slot group from the center) are overlapped with each other. The slots 133 of the innermost first slot group are positioned on the flat surface 146. The centroid positions of the second recesses 153 are overlapped with the slots 133.

Figure 9A:
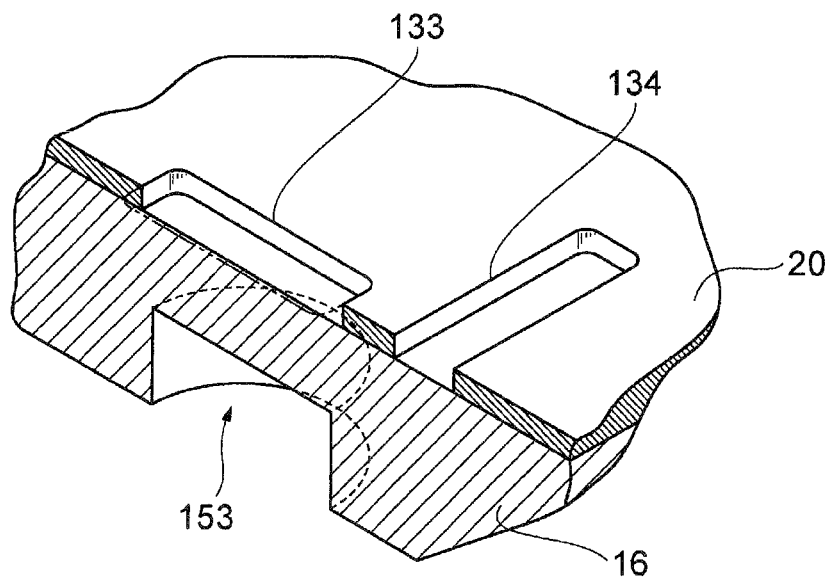
FIGS. 9A and 9B are a perspective view and a cross sectional view showing a structure around the slot and the recess, respectively.
Figure 9B:
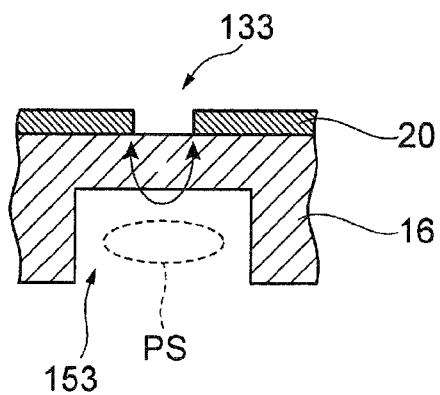

FIGS. 9A and 9B are a perspective view and a cross sectional view showing a structure around the slot 133 and the recess 153, respectively. As shown in FIG. 9A, the slot 133 is positioned directly above the recess 153. When the microwave is introduced, a plasma PS is generated in the recess 153 by the electric field generated in the width direction of the slot 133 (see FIG. 9B).

Figure 10A:
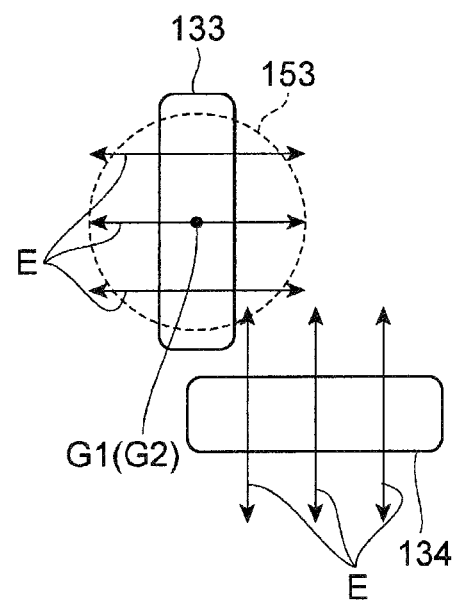
FIGS. 10A and 10B show positional relationship between the slots and the recesses.
Figure 10B:
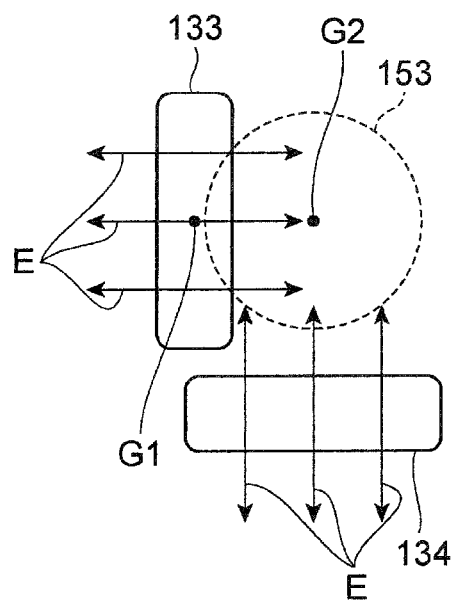

FIGS. 10A and 10B show the position relation between the slots and the second recess. FIG. 10A shows the case where the centroid G2 of the second recess 153 is set to a position where the electric field E from the slot 133 is selectively introduced. Due to the introduction of the microwave, the electric field E is generated in the width direction of the slots 133 and 134. In this example, the centroid position G1 of the slot 133 and the centroid position G2 of the second recess 153 coincide with each other, and the centroid position G2 of the second recess 153 is positioned in the slot 133. In this case, the plasma is reliably confined in the second recess 153, so that there are little fluctuation in the plasma state and little in-plane variation of the plasma state in spite of changes in various conditions. Especially, since the second recesses 153 are formed at the central flat surface 146 (see FIG. 7), a surface surrounding a single recess 153 has a high equivalence and, thus, the degree of plasma confinement becomes high.

Meanwhile, FIG. 10B shows the case where the centroid position G2 of the second recess 153 is set to a position where the electric fields E from the slots 133 and 134 are introduced. In other words, in FIG. 10B, the centroid position G1 of the slot 133 is separated from the center G2 of the second recess 153 and the centroid position G2 of the second recess 153 is not positioned in the slot 133. In this case, the microwaves are not easily introduced into the recess 153 compared to the case shown in FIG. 10A. Accordingly, the plasma density is decreased and there may be fluctuation in plasma generation.

Next, an antenna of a comparative example will be briefly described in order to explain the operational effect of the antenna 70 and the plasma processing apparatus 1 of the present embodiment.

Figure 11:
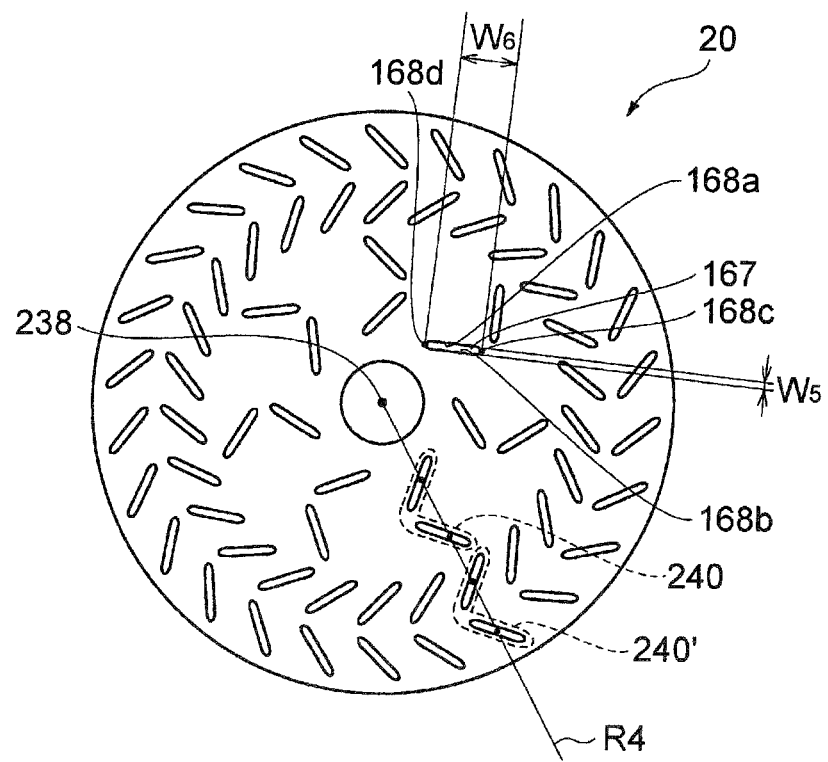
FIG. 11 is a top view of a slot plate of a comparative example.
Figure 12:
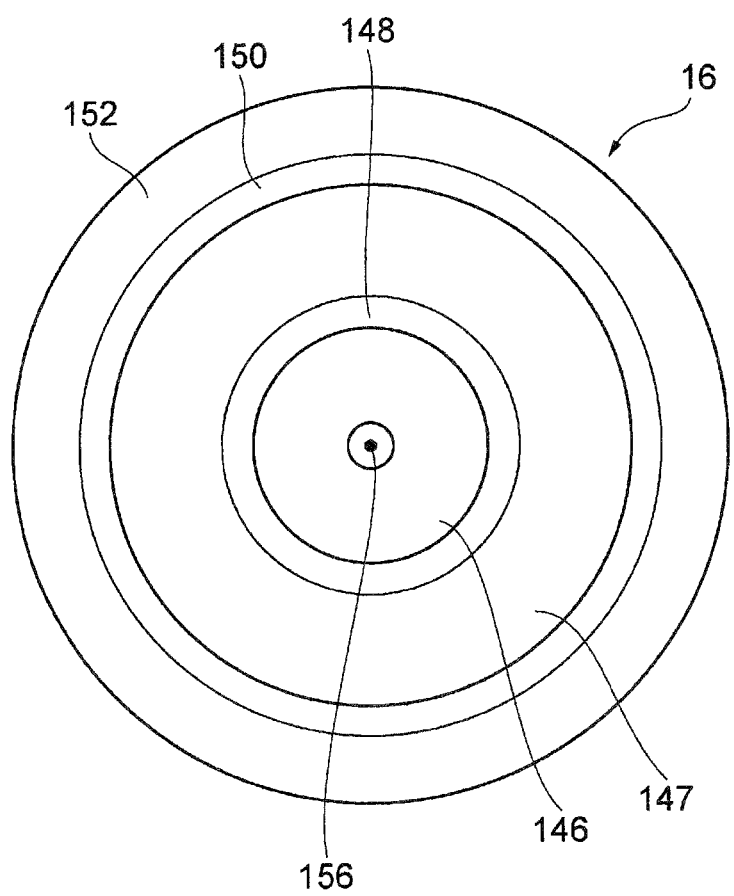
FIG. 12 is a top view of a dielectric window of the comparative example.

FIG. 11 is a top view of a slot plate of the comparative example. In this slot plate 20, the slot pairs 240 and 240' are arranged in a concentric circular shape around the center (centroid position) 238 of the slot plate 20. The inner slot pair group disposed at an inner peripheral side includes seven slot pairs 240. The outer slot pair group disposed at the outer peripheral side includes twenty-eight slot pairs 240'. An opening width of the slot 167 of the slot pair 240, i.e., a distance $W_5$ between one wall 168a and the other wall 168b both extending in a lengthwise direction of the slot 167, is set to 6 mm. The length $W_5$ is about one half of the length $W_1$ of the slot 133 of the aforementioned slot plate. A length $W_6$ in a lengthwise direction of the slot 167, i.e., a length between one end 168c and the other end 168d in the lengthwise direction of the slot 167, is set to 35 mm. The length $W_6$ is the same as the length $W_2$ of the slot 133 of the aforementioned slot plate. A ratio $W_5/W_6$ of the short side to the long side in the slot 167 is 6/35≈0.17. The other structures of the slot are the same as those of the slot plate 20 shown in FIG. 5, so that the description thereof will be omitted. FIG. 12 is a top view of a dielectric window of the comparative example. The dielectric window 16 of the comparative example does not have the second recesses formed on the flat surface 146.

As shown in FIG. 11, in the comparative example, the slot pairs 240 and 240' are disposed at positions where straight lines R4 extending from the centroid position 238 of the slot plate 20 and passing through each of the slot pairs 240 and 240' are overlapped with each other (coincide with each other). That is, the slot pairs 240 and 240' are overlapped when seen from the centroid position 238 of the slot plate toward the outer region in the diametrical direction. In that case, the microwave incident on the centroid position 238 of the slot plate 20 is initially radiated from the slot pair 240 close to the centroid position 238. Therefore, the microwave having a low electric field intensity propagates to the other slot pair 240' disposed on the straight line R4 extending from the centroid position 238 and passing through the corresponding slot pair 240. Accordingly, the microwave having a low electric field intensity is radiated from the other slot pair 240'.

On the other hand, in the antenna 70 and the plasma processing apparatus 1 of the present embodiment, the slot pairs 140 and 140' arranged in a concentric circular shape are provided at positions where the straight lines R1 to R3 extending from the centroid position 138 of the slot plate passing through the slot pairs 140 and 140' are not overlapped with each other. In other words, other slot pairs are not provided on the straight line R1 extending from the centroid position 138 of the slot plate 20 toward the slot pair 140. Accordingly, the slot pairs having a low microwave radiation efficiency for an input power can be excluded, which makes it possible to relatively improve distribution of the input power to the other slot pairs. As a result, the radiation electric field intensity with respect to the input power is improved. When the radiation electric field intensity with respect to the input power is improved, a sheet-shaped high-density plasma can be generated directly below the ceiling plate and, thus, the plasma stability can be improved. As a result, a pressure range where the plasma is stable is increased and, hence, the expansion of the processing region can be expected.

As described above, a negative gas has an electron attachment cross section area at the electron energy of 10 eV or less. Therefore, the negative gas is easily turned into negative ions due to the attachment of electrons in the plasma diffusion region. Accordingly, in the plasma processing using a negative gas, electrons and negative ions exist together as negative charges in the plasma. When the electrons are attached to the negative gas, loss is caused. In order to maintain stability of a plasma, it is required to increase the number of electrons that are generated to compensate the loss. Accordingly, in the plasma processing using a negative gas, the electric field intensity needs to be improved compared to the case of using other gases. In the antenna 70 and the plasma processing apparatus 1 of the present embodiment, the radiation electric field intensity with respect to the input power can be improved. Hence, the stability of the plasma can be improved even when a negative gas is used. Especially, it is expected that an etching process inflicts less damage at a pressure range from an intermediate pressure (e.g., about 50 mTorr (6.5 Pa)) in which negative ions are easily generated to a high pressure.

In the antenna 70 and the plasma processing apparatus 1 of the present embodiment, the width $W_1$ of the slots of the first and second slot groups is greater than the width $W_3$ of the slots of the third and fourth slot groups. As the opening width of the slot is increased, the electric field of the introduced microwave is decreased. When the opening width of the slot is decreased, the microwave can be more strongly radiated. Therefore, it is possible to lower the radiation electric field intensity of the first and second slot groups close to the centroid position 138 of the slot plate 20 than that of the third and fourth slot groups far from the centroid position 138 of the slot plate 20. The microwave is attenuated during propagation. Therefore, the radiation electric field intensity of the microwave becomes uniform over the surface of the slot plate by employing the above-described configuration. As a result, a plasma having high in-plane uniformity can be generated.

In the antenna 70 and the plasma processing apparatus 1 of the present embodiment, when seen from a direction perpendicular to the main surface of the slot plate 20, the centroid positions of the second recesses 153 are positioned in the slots 133 of the slot plate 20. Accordingly, the plasma having high uniformity can be generated and the in-plane uniformity of the processing amount can be improved. Such a plasma processing apparatus 1 may be used for film deposition as well as etching.

While various embodiments have been described above, the present invention may be modified without being limited to the above embodiments. For example, although the above embodiments have described an example in which the slot pairs are arranged in the form of two concentric circular rings, the slot pairs may be arranged in the form of three or more circular rings.

TEST EXAMPLES

Hereinafter, test examples and comparative examples which have been carried out by the present inventors will be described to explain the above-described effect.

(Examination of Improvement of Electric Field Intensity)

Test Example 1

The antenna including the antenna plate shown in FIG. 5 and the dielectric window shown in FIG. 6 was used.

Comparative Example 1

The antenna including the antenna plate shown in FIG. 11 and the dielectric window shown in FIG. 12 was used.

Figure 13:
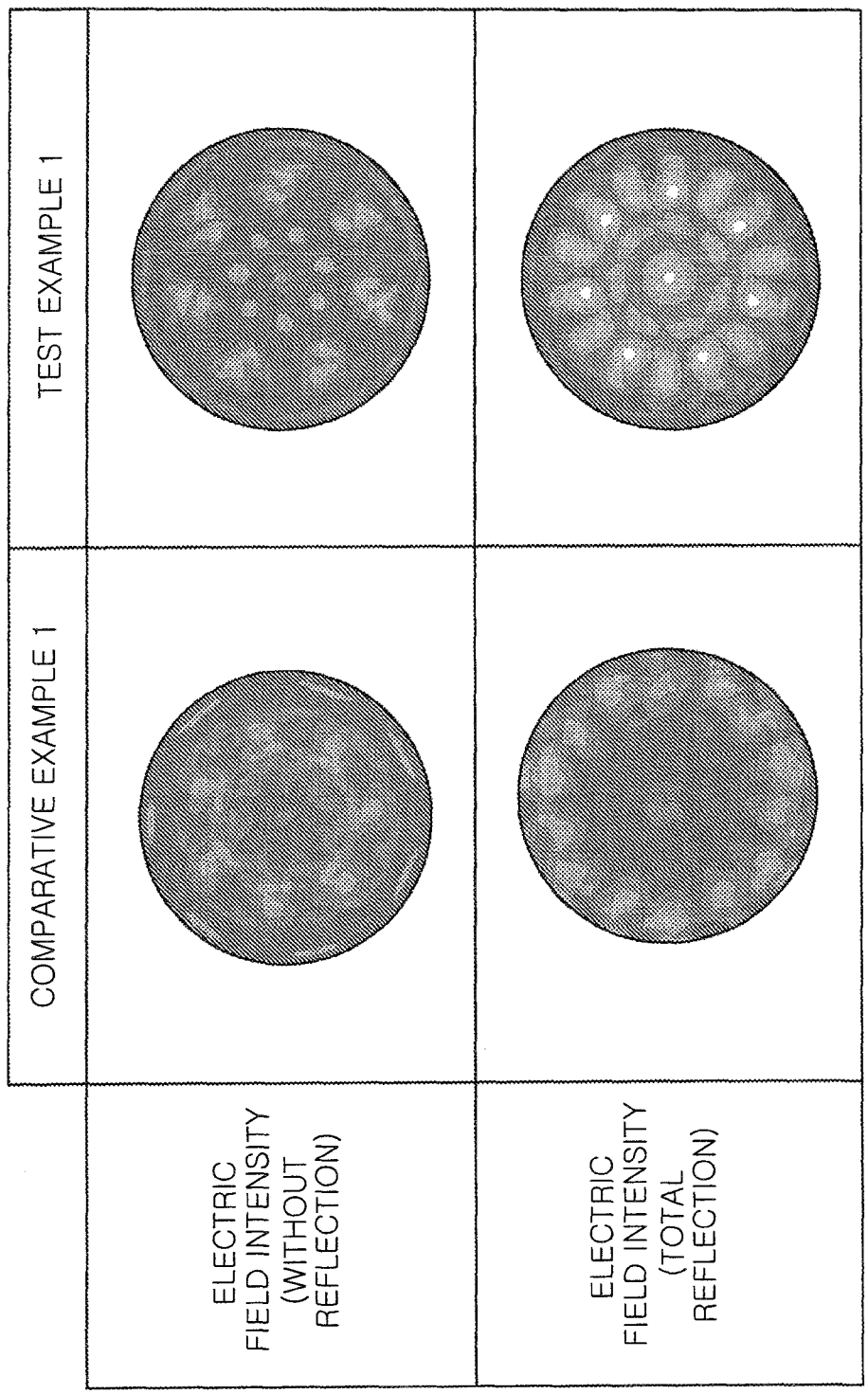
FIG. 13 shows a simulation result of an incident wave and an ignition electric field in a test example and a comparative example.

In the test example 1 and the comparative example 1, the simulation of an electric field intensity was executed. The case where the microwave was totally transmitted and the case where the microwave was totally reflected were simulated. The results thereof are shown in FIG. 13. FIG. 13 shows the radial line slot antenna seen from the bottom along the Z-axis shown in FIG. 1. In FIG. 13, the distribution of the electric field intensity was illustrated in monotone. In FIG. 13, a highest electric field intensity is illustrated by white color and a lowest electric field intensity is illustrated by black color. As can be seen from FIG. 13, white portions are wider in the test example 1 than the comparative example 1. This shows that the radiation electric field intensity with respect to the input power is improved in the antenna of the present embodiment.

(Examination of Improvement of Plasma Stability)

Test Example 2

In the plasma processing apparatus 1 including the antenna 70 having the antenna plate shown in FIG. 5 and the dielectric window shown in FIG. 6, a plasma was generated by inputting microwave and applying RF and plasma stability was evaluated while varying a pressure.

The plasma stability was evaluated on two patterns: a pattern of increasing a pressure from 40 mTorr (5.2 Pa) to 200 mTorr (26 Pa) and a pattern of decreasing a pressure from 200 mTorr (26 Pa) to 40 mTorr (5.2 Pa).

The case of etching a silicon-based film such as polysilicon or the like was selected as a model example, and Ar/HBr was used as a processing gas. Three gas conditions were prepared. In a first gas condition, flow rates of Ar/HBr were set to 1000 (sccm)/600 (sccm). In a second gas condition, flow rates of Ar/HBr were set to 800 (sccm)/800 (sccm). In a third gas condition, flow rates of Ar/HBr were set to 600 (sccm)/1000 (sccm). HBr is a negative gas.

A microwave power (microwave generator 35) was set to 3000 W and a RF power (bias power supply BV) was set to 150 W.

Comparative Example 2

In the plasma processing apparatus including the antenna having the antenna plate shown in FIG. 11 and the dielectric window shown in FIG. 12, a plasma was generated by inputting microwave and applying RF and plasma stability was evaluated while varying a pressure. The pressure and the gas conditions were set to be the same as those in the test example 2.

(Evaluation Method)

Figure 14A:
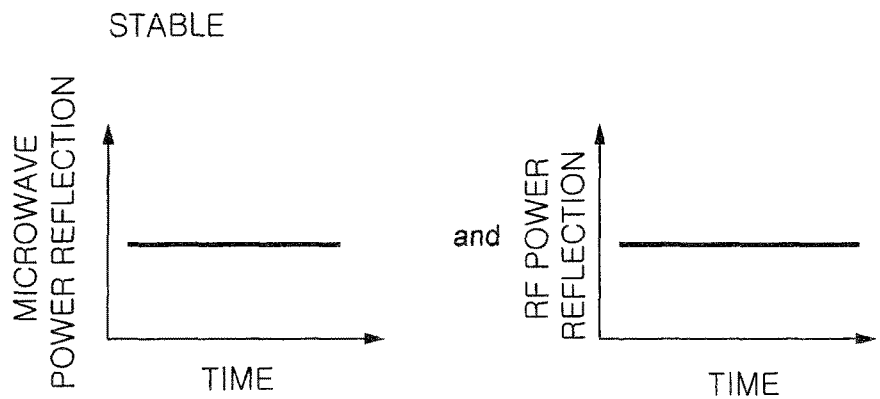
FIGS. 14A to 14D are views for explaining stability of a microwave and a RF.
Figure 14B:
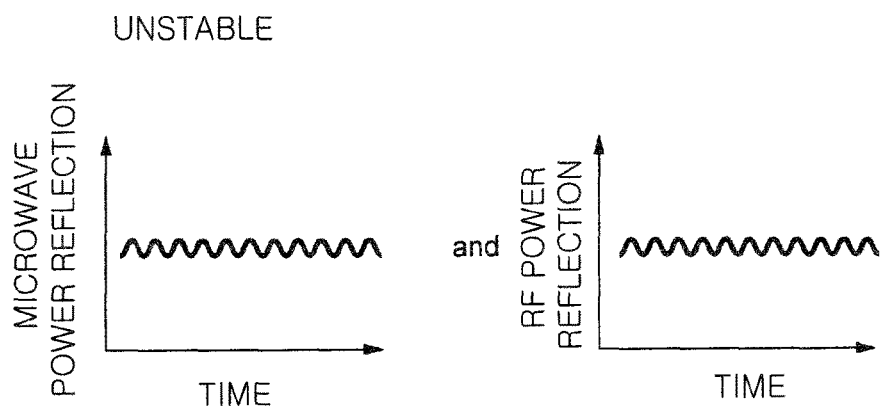
Figures 14C, 14D:
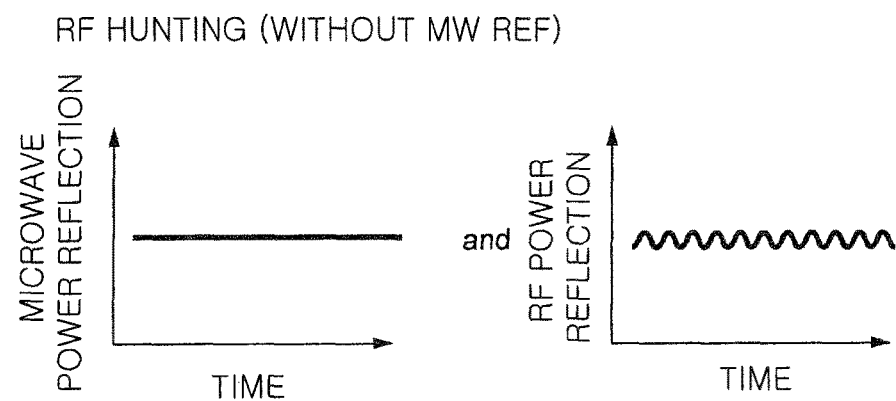

The plasma stability was evaluated by classifying the plasma generated under the above conditions into four categories including Stable, Unstable, RF-hunting and Relatively-unstable. FIGS. 14A to 14D are views for explaining the category classification. As shown in FIG. 14A, the plasma stability was determined to be "Stable" when time-dependent microwave power reflection is constant (within a predetermined threshold value with respect to a reference value) and time-dependent RF power reflection is constant (within a predetermined threshold value with respect to a reference value). As shown in FIG. 14B, the plasma stability was determined to be "Unstable" when the time-dependent microwave power reflection is not constant (not within the threshold value with respect to the reference value) and the time-dependent RF power reflection is not constant (not within the threshold value with respect to the reference value). As shown in FIG. 14C, the plasma stability was determined to be "RF-hunting" when the time-dependent microwave power reflection is constant (within the predetermined threshold value with respect to the reference value) and the time-dependent RF power reflection is not constant (not within the predetermined threshold value with respect to the reference value). As shown in FIG. 14D, the plasma stability was determined to be "Relatively-unstable" when the time-dependent microwave power reflection or the time-dependent RF reflection power has a peak value (instantly exceeding the predetermined threshold value with respect to the reference value). The results thereof are shown in FIGS. 15A and 15B.

As can be seen from the test results of the test example 2 and the comparative example 2 shown in FIGS. 15A and 15B, the plasma was stable in the test example 2. In the comparative example 2, the plasma was unstable at an intermediate pressure range (50 mTorr (6.5 Pa)) in the case of using the negative gas. In contrast, in the test example 2, the plasma stability was improved at an intermediate pressure range even in the case of using the negative gas.

Test Example 3

The microwave power was set to 2000 W. The other conditions were set to be the same as those in the test example 2.

Comparative Example 3

The microwave power was set to 2000 W. The other conditions were set to be the same as those in the comparative example 2.

The test example 3 and the comparative example 3 were evaluated by the above-described evaluation method. The results thereof are shown in FIGS. 16A and 16B.

Figure 16A:
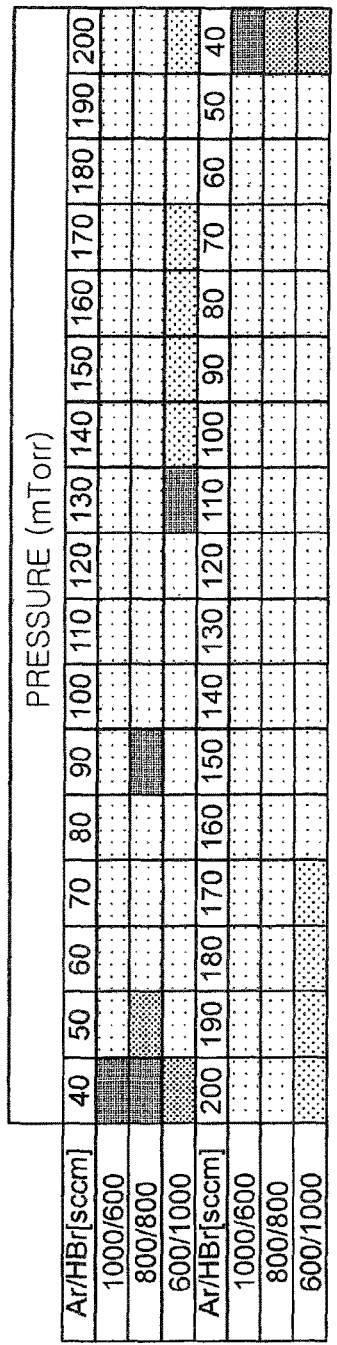
FIGS. 16A and 16B show the stability evaluation results of the microwave and the RF in the test example and the comparative example.
Figure 16B:
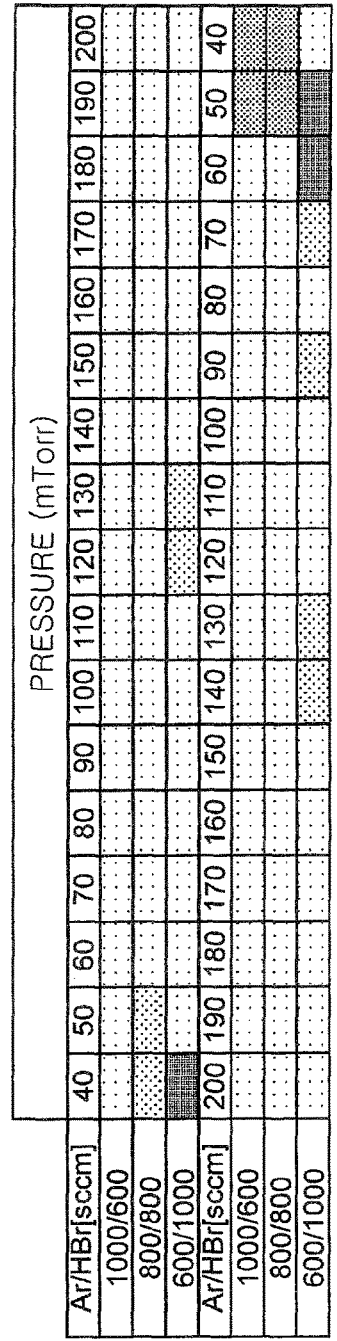

As can be seen from the test results of the test example 3 and the comparative example 3 shown in FIGS. 16A and 16B, the plasma was stable in the test example 3. In the comparative example 3, the plasma was unstable at the intermediate pressure range or above (50 mTorr (6.5 Pa) or above) in the case of using the negative gas. In contrast, in the test example 3, the plasma stability was improved at the intermediate pressure range or above even in the case of using the negative gas.

Test Example 4

The case of cleaning the apparatus was selected as a model example, and $SF_6/O_2$ was used as a processing gas. Three gas conditions were prepared. In a first gas condition, flow rates of $SF_6/O_2$ were set to 50 sccm/150 sccm. In a second gas condition, flow rates of $SF_6/O_2$ were set to 100 sccm/100 sccm. In a third gas condition, flow rates of $SF_6/O_2$ were set to 150 sccm/50 sccm. $SF_6$ is a negative gas.

The RF power was set to 0 W. The other conditions were set to be the same as those in the test example 2.

Comparative Example 4

The case of cleaning the apparatus was selected as a model example, and $SF_6/O_2$ was used as a processing gas. Three gas conditions were prepared. In a first gas condition, flow rates of $SF_6/O_2$ were set to 50 sccm/150 sccm. In a second gas condition, flow rates of $SF_6/O_2$ were set to 100 sccm/100 sccm. In a third gas condition, flow rates of $SF_6/O_2$ were set to 150 sccm/50 sccm. $SF_6$ is a negative gas.

The RF power was set to 0 W. The other conditions were set to be the same as those in the comparative example 2.

The test example 4 and the comparative example 4 were evaluated by the above-described evaluation method. The results thereof are shown in FIG. 17.

Figure 17A:
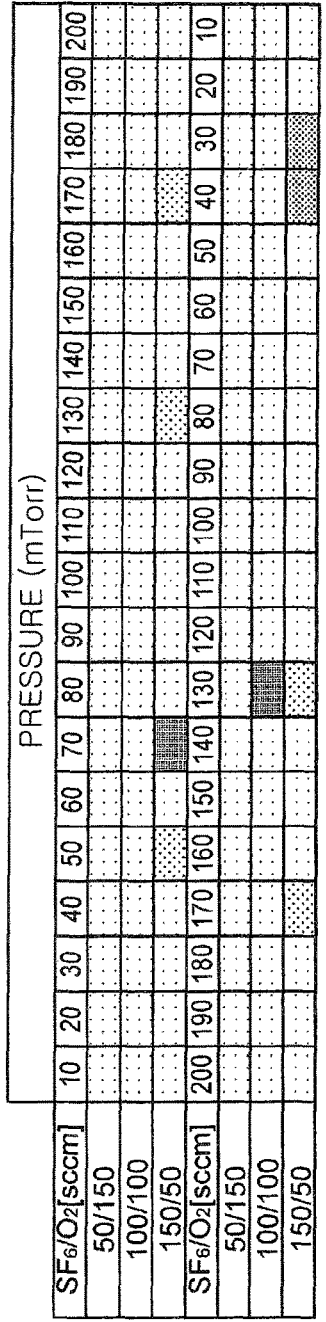
FIGS. 17A and 17B show the stability evaluation results of the microwave and the RF in the test example and the comparative example.
Figure 17B:
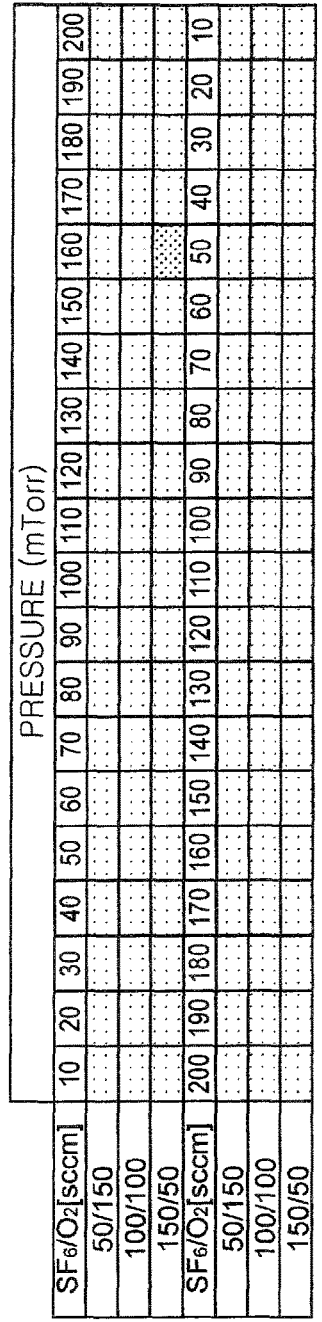

As can be seen from the test results of the test example 4 and the comparative example 4 shown in FIG. 17, the plasma was stable in the test example 4. In the comparative, example 4, the plasma was unstable at the intermediate pressure range or above (50 mTorr (6.5 Pa) or above) in the case of using the negative gas. In contrast, in the test example 4, the plasma stability was improved at the intermediate pressure range or above even in the case of using the negative gas.

(Examination of Stability of Plasma Discharge)

Test Example 5

A time-dependent emission intensity was acquired to examine stability of plasma discharge after a predetermined period of time has elapsed from ignition. The followings are the processing conditions.

[Ar Ignition]
Microwave power: 2000 W
Pressure: 100 Torr (13 Pa)
Gas Flow Rates
Ar gas: 500 sccm
Processing time: 8 sec
[Cleaning Process]
Microwave power: 3000 W
Pressure: 20 Torr (2.6 Pa)
Gas Flow Rates
$SF_6$ gas: 100 sccm
$O_2$ gas: 100 sccm
Processing time: 30 sec That is, the ignition was performed by using Ar and then, a plasma of the negative gas was generated.

Figures 18A, 18B, 18C:
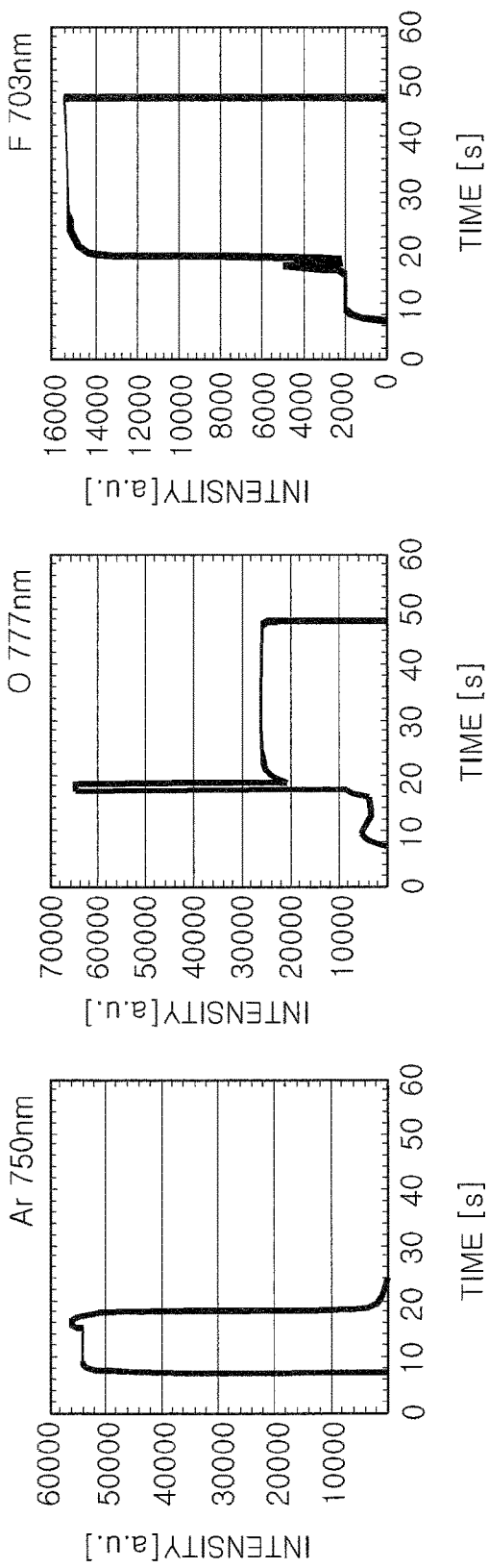
FIGS. 18A to 18C show discharge stability evaluation results in the test example.

FIGS. 18A to 18C show the results thereof. FIG. 18A shows the result of time dependence of emission intensity of Ar. FIG. 18B shows the result of time dependence of emission intensity of O. FIG. 18C shows the result of time dependence of emission intensity of F. Conventionally, when Ar plasma emission is shifted to O or F plasma emission (e.g., around 20 seconds), O plasma or F plasma is once extinguished and then generated, so that the emission intensity becomes zero around 20 seconds. On the other hand, in the test example 5 shown in FIGS. 18A to 18C, even when Ar plasma emission was shifted to O or F plasma emission, the temporary stop of the plasma discharge did not occur. Accordingly, it is seen that in the test example 5, the plasma stability was improved even when using the negative gas.

Test Example 6

Time dependent emission intensity was acquired to examine stability of plasma discharge after a predetermined period of time has elapsed from the ignition. The microwave power was set to 2500 W. The other conditions were set to be the same as those in the test example 5.

FIGS. 19A to 19C show the results thereof. FIG. 19A shows the result of time dependence of emission intensity of Ar. FIG. 19B shows the result of time dependence of emission intensity of O. FIG. 19C shows the result of the time dependence of emission intensity of F. As can be seen from FIGS. 19A to 19C, the plasma stability was improved even when using the negative gas, as in the case shown in FIGS. 18A to 18C.

While the invention has been shown and described with respect to the embodiments, it will be understood by those skilled in the art that various changes and modifications may be made without departing from the scope of the invention as defined in the following claims.

What is claimed is:

1. An antenna comprising:
a dielectric window; and
a slot plate provided at one surface of the dielectric window, the slot plate including a plurality of slot pairs each being formed of two slots,
wherein the slot pairs are concentrically disposed about a centroid position of the slot plate and provided at positions where straight lines extending from the centroid position of the slot plate and passing through each slot pair are not overlapped with each other,
wherein the slot plate includes:
(i) a first slot group having a plurality of slots spaced from the centroid position of the slot plate by a first distance,
(ii) a second slot group having a plurality of slots spaced from the centroid position of the slot plate by a second distance,
(iii) a third slot group having a plurality of slots spaced from the centroid position of the slot plate by a third distance, and
(iv) a fourth slot group having a plurality of slots spaced from the centroid position of the slot plate by a fourth distance,
wherein a relationship between the first to the fourth distance satisfies the first distance <the second distance <the third distance <the fourth distance,
wherein slots in the first slot group and slots in the second slot group which correspond to each other form a plurality of first slot pairs, and slots in the third slot group and slots in the fourth slot group which correspond to each other form a plurality of second slot pairs,
wherein a slot in the second slot group of each first slot pair is positioned on a first straight line extending from the centroid position of the slot plate and passing through a slot in the first slot group of the corresponding first slot pair,
wherein a slot in the fourth slot group of each second slot pair is positioned on a second straight line extending from the centroid position of the slot plate and passing through a slot in the third slot group of the corresponding second slot pair,
wherein each of the slots on the slot plate belong in one of the first slot group, second slot group, third slot group, and fourth slot group, and all the slots are arranged such that (i) the first straight line and the second straight line are not overlapped with each other, and (ii) each first straight line does not intersect with (a) each of the slots in the third slot group and (b) each of slots in the fourth slot group,
wherein the other surface of the dielectric window includes:
(i) a flat surface surrounded by an annular first recess, and
(ii) a plurality of second recesses formed in the flat surface so as to surround a centroid position of the flat surface, and
wherein when seen from a direction perpendicular to a main surface of the slot plate, a centroid position of each of the second recesses is positioned in each of the slots of the first slot group.

2. The antenna of claim 1, wherein the number of the slots in the first slot group and the number of the slots in the second slot group are the same number denoted by N1; and the number of the slots in the third slot group and the number of the slots in the fourth slot group are the same number denoted by N2, wherein N2 is an integer multiple of N1.

3. The antenna of claim 1, wherein a width of the slots in the first slot group is the same as a width of the slots in the second slot group;
a width of the slots in the third slot group is the same as a width of the slots in the fourth slot group; and
the width of the slots in the first slot group and the width of the slots in the second slot group are greater than the width of the slots in the third slot group and the width of the slots in the fourth slot group.

4. The antenna of claim 1, wherein an angle between a straight line extending from the centroid position of the slot plate and passing through the centroid of each slot and a lengthwise direction of the corresponding slot is the same in each of the first to the fourth slot group;
a slot in the first slot group and a slot in the second slot group that are positioned on the same straight line extending from the centroid position of the slot plate are elongated in different directions; and
a slot in the third slot group and a slot in the fourth slot group that are positioned on the same straight line extending from the centroid position of the slot plate are elongated in different directions.

5. The antenna of claim 1, wherein the second recesses have a circular shape in a plan view.

6. A plasma processing apparatus comprising:
the antenna of claim 1;
a processing chamber including the antenna;
a mounting table provided in the processing chamber to face the other surface of the dielectric window, the mounting table configured to mount thereon a substrate to be processed; and
a microwave introduction line configured to connect a microwave generator and the slot plate.

7. An antenna comprising:
a dielectric window; and
a slot plate provided at one surface of the dielectric window, the slot plate including a plurality of slot pairs each being formed of two slots,
wherein the slot pairs are concentrically disposed about a centroid position of the slot plate and provided at positions where straight lines extending from the centroid position of the slot plate and passing through each slot pair are not overlapped with each other,
wherein the slot plate includes:
(i) a first slot group having a plurality of slots spaced from the centroid position of the slot plate by a first distance,
(ii) a second slot group having a plurality of slots spaced from the centroid position of the slot plate by a second distance,
(iii) a third slot group having a plurality of slots spaced from the centroid position of the slot plate by a third distance,
(iv) a fourth slot group having a plurality of slots spaced from the centroid position of the slot plate by a fourth distance,
(v) a fifth slot group having a plurality of slots spaced from the centroid position of the slot plate by the third distance, and
(vi) a sixth slot group having a plurality of slots spaced from the centroid position of the slot plate by the fourth distance,
wherein a relationship between the first to the fourth distance satisfies the first distance <the second distance <the third distance <the fourth distance,
wherein slots in the first slot group and slots in the second slot group which correspond to each other form a plurality of first slot pairs, slots in the third slot group and slots in the fourth slot group which correspond to each other form a plurality of second slot pairs, and slots in the fifth slot group and slots in the sixth slot group which correspond to each other form a plurality of third slot pairs,
wherein sets of two slot pairs are formed from corresponding second slot pairs and third slot pairs,
wherein a slot in the second slot group of each first slot pair is positioned on a first straight line extending from the centroid position of the slot plate and passing through a slot in the first slot group of the corresponding first slot pair,
wherein a slot in the fourth slot group of each second slot pair is positioned on a second straight line extending from the centroid position of the slot plate and passing through a slot in the third slot group of the corresponding second slot pair,
wherein a slot in the sixth slot group of each second slot pair is positioned on a third straight line extending from the centroid position of the slot plate and passing through a slot in the fifth slot group of the corresponding third slot pair,
wherein all the slots are arranged such that the first straight line, the second straight line, and the third straight line are not overlapped with each other,
wherein each of the slots on the slot plate belong in one of the first slot group, the second slot group, the third slot group, the fourth slot group, the fifth slot group, and the sixth slot group, and
wherein the sets of two slot pairs are spaced from each other at a regular interval in a circumferential direction such that each of the sets of two slot pairs do not overlap with any of the first slot pairs from the plurality of the first slot pairs along each first straight line.

8. The antenna of claim 7, wherein the number of the first slot pairs is the same as the number of the sets of two slot pairs.

9. A plasma processing apparatus comprising:
the antenna of claim 7;
a processing chamber including the antenna;
a mounting table provided in the processing chamber to face the other surface of the dielectric window, the mounting table configured to mount thereon a substrate to be processed; and
a microwave introduction line configured to connect a microwave generator and the slot plate.

* * * * *